United States Patent
Yano et al.

(10) Patent No.: US 8,232,552 B2
(45) Date of Patent: Jul. 31, 2012

(54) NONCRYSTALLINE OXIDE SEMICONDUCTOR THIN FILM, PROCESS FOR PRODUCING THE NONCRYSTALLINE OXIDE SEMICONDUCTOR THIN FILM, PROCESS FOR PRODUCING THIN-FILM TRANSISTOR, FIELD-EFFECT-TRANSISTOR, LIGHT EMITTING DEVICE, DISPLAY DEVICE, AND SPUTTERING TARGET

(75) Inventors: Koki Yano, Chiba (JP); Kazuyoshi Inoue, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 350 days.

(21) Appl. No.: 12/593,045

(22) PCT Filed: Mar. 26, 2008

(86) PCT No.: PCT/JP2008/055634
§ 371 (c)(1),
(2), (4) Date: Feb. 22, 2010

(87) PCT Pub. No.: WO2008/117810
PCT Pub. Date: Oct. 2, 2008

(65) Prior Publication Data
US 2010/0155717 A1 Jun. 24, 2010

(30) Foreign Application Priority Data
Mar. 26, 2007 (JP) .................. 2007-078996

(51) Int. Cl.
H01L 29/10 (2006.01)
H01L 29/12 (2006.01)
(52) U.S. Cl. ..... 257/43; 257/59; 257/347; 257/E29.101; 257/E29.273; 257/E21.471; 257/E21.497; 438/104; 438/34; 438/796
(58) Field of Classification Search ............ 257/43, 257/59, 347, E29.101, E29.273, E21.471, 257/E21.497; 438/104, 34, 796
See application file for complete search history.

(56) References Cited

U.S. PATENT DOCUMENTS
5,744,864 A 4/1998 Cillessen et al.
(Continued)

FOREIGN PATENT DOCUMENTS
JP 60 198861 10/1985
(Continued)

OTHER PUBLICATIONS
Orita, M et al., "Amorphous transparent conductive oxide $InGaO_3(ZnO)_m$ (m ≦ 4): a Zn 4s conductor," Philosophical Magazine B, 2001, vol. 81, No. 5, pp. 501-515.
(Continued)

*Primary Examiner* — Tu-Tu Ho
(74) *Attorney, Agent, or Firm* — Millen, White, Zelano & Branigan PC

(57) ABSTRACT

This invention provides an amorphous oxide semiconductor thin film, which is insoluble in a phosphoric acid-based etching solution and is soluble in an oxalic acid-based etching solution by optimizing the amounts of indium, tin, and zinc, a method of producing the amorphous oxide semiconductor thin film, etc. An image display device (1) comprises a glass substrate (10), a liquid crystal (40) as a light control element, a bottom gate-type thin film transistor (1) for driving the liquid crystal (40), a pixel electrode (30), and an opposing electrode (50). The amorphous oxide semiconductor thin film (2) in the bottom gate-type thin film transistor (1) has a carrier density of less than $10^{+18}$ cm$^{-3}$, is insoluble in a phosphoric acid-based etching liquid, and is soluble in an oxalic acid-based etching liquid.

18 Claims, 5 Drawing Sheets

U.S. PATENT DOCUMENTS

| | | | |
|---|---|---|---|
| 6,669,830 B1 * | 12/2003 | Inoue et al. | 204/298.13 |
| 7,189,992 B2 | 3/2007 | Wager et al. | |
| 7,262,463 B2 | 8/2007 | Hoffman et al. | |
| 2007/0037402 A1 | 2/2007 | Inoue et al. | |
| 2007/0194379 A1 | 8/2007 | Hosono et al. | |
| 2010/0155717 A1 | 6/2010 | Yano et al. | |
| 2010/0170696 A1 | 7/2010 | Yano et al. | |

FOREIGN PATENT DOCUMENTS

| | | |
|---|---|---|
| JP | 10 083719 | 3/1998 |
| JP | 11 505377 | 5/1999 |
| JP | 2000 256061 | 9/2000 |
| JP | 2004 240091 A | 8/2004 |
| JP | 2006 502597 | 1/2006 |
| JP | 2006 165527 | 6/2006 |
| JP | 2006 165529 A | 6/2006 |
| JP | 2006 186319 A | 7/2006 |
| JP | 2006 210033 | 8/2006 |
| JP | 2006 528843 | 12/2006 |
| WO | WO-2005 088726 A1 | 9/2005 |
| WO | WO-2007 026783 A1 | 3/2007 |
| WO | WO-2008 117810 A1 | 10/2008 |

OTHER PUBLICATIONS

International Search Report for PCT/JP2008/055634 dated May 13, 2008.

Idemitsu Kosan Co Ltd., "Transparent conductive material, transparent conductive glass and transparent conductive film," Patent Abstracts of Japan, Publication Date: Sep. 19, 2000; English Abstract of JP 2000 256061.

Idemitus Kosan Co Ltd., "Laminated circuit board having al wiring and coated with transparent conductive film, and manufacturing method thereof," Patent Abstracts of Japan, Publication Date: Aug. 10, 2006; English Abstract of JP2006 210033.

Minami Uchitsugu Takada Shinzo, "Transparent conductive film," Patent Abstracts of Japan, Publication Date: Mar. 31, 1998; English Abstract of JP 10-083719.

Fujitsu Ltd, "Thin film transistor," Patent Abstracts of Japan, Publication Date: Oct. 8, 1985; English Abstract of JP-60 198861.

Canon, Inc., "Field effect transistor," Patent Abstracts of Japan, Publication Date: Jun. 22, 2006; English Abstract of JP-2006 165527.

Canon, Inc., "Light emitting device and indicating device," Patent Abstracts of Japan, Publication Date: Jul. 13, 2006; English Abstract of JP 2006-186319.

Canon, Inc., "Amorphous oxide and field effect transistor," Patent Abstracts of Japan, Publication Date: Jun. 22, 2006: English Abstract of JP 2006-165529.

* cited by examiner

FIG. 1
TABLE 1

| | | Example | | | | | | | | | |
|---|---|---|---|---|---|---|---|---|---|---|---|
| | | 1 | 2 | 3 | 4 | 5 | 6 | 7 | 8 | 9 | 10 |
| Film-forming conditions | Substrate temperature [°C] | 25 | 25 | 25 | 25 | 25 | 25 | 25 | 25 | 25 | 25 |
| | Ultimate pressure [×10$^{-4}$ Pa] | 5 | 5 | 5 | 5 | 5 | 5 | 5 | 5 | 5 | 5 |
| | Atmosphere gas | Ar:100% | Ar:100% | Ar:100% | Ar:100% | Ar:100% | Ar:100% | Ar:100% | Ar:100% | Ar:96% O2:4% | Ar:100% |
| | Total pressure [Pa] | 0.4 | 0.4 | 0.4 | 0.4 | 0.4 | 0.4 | 0.4 | 0.4 | 0.4 | 0.4 |
| | Partial pressure of oxygen [×10$^{-3}$ Pa] | 0 | 0 | 0 | 0 | 0 | 0 | 0 | 0 | 16 | 0 |
| Film composition atomic ratios | In/(In+Sn+Zn) | 0.20 | 0.31 | 0.31 | 0.43 | 0.20 | 0.20 | 0.43 | 0.43 | 0.43 | 0.43 |
| | Sn/(In+Sn+Zn) | 0.15 | 0.11 | 0.15 | 0.14 | 0.23 | 0.15 | 0.14 | 0.14 | 0.14 | 0.14 |
| | Zn/(In+Sn+Zn) | 0.65 | 0.59 | 0.54 | 0.43 | 0.57 | 0.65 | 0.43 | 0.43 | 0.43 | 0.43 |
| | IIIB/(In+Sn+Zn+IIIB) | 0.00 | 0.00 | 0.00 | 0.00 | 0.00 | 0.10 | 0.10 | 0.20 | 0.20 | 0.10 |
| | IIIB group element | — | — | — | — | — | Ga | Ga | Ga | Ga | Al |
| | Ln/(In+Sn+Zn+Ln) | 0.00 | 0.00 | 0.00 | 0.00 | 0.00 | 0.00 | 0.00 | 0.00 | 0.00 | 0.00 |
| | Lanthanoid series element | — | — | — | — | — | — | — | — | — | — |
| Treatment to increase resistance | | Atmospheric heat treatment 280°C 2 hours | Atmospheric heat treatment 280°C 2 hours | Atmospheric heat treatment 280°C 2 hours | Atmospheric heat treatment 280°C 2 hours | Atmospheric heat treatment 280°C 2 hours | Atmospheric heat treatment 280°C 2 hours | Atmospheric heat treatment 280°C 2 hours | Atmospheric heat treatment 280°C 2 hours | Nil | Atmospheric heat treatment 280°C 2 hours |
| Properties of semiconductor thin film | Crystallinity (X-ray diffraction) | Amorphous | Amorphous | Amorphous | Amorphous | Amorphous | Amorphous | Amorphous | Amorphous | Amorphous | Amorphous |
| | Hall measurement: Carrier concentration [cm$^{-3}$] | 5×10$^{16}$ | 9×10$^{16}$ | 1.2×10$^{17}$ | 5×10$^{17}$ | 8×10$^{17}$ | 9×10$^{15}$ | 1×10$^{17}$ | 1×10$^{16}$ | 1×10$^{16}$ | 2×10$^{17}$ |
| | Hall measurement: Hall mobility [cm$^2$/Vs] | 3 | 10 | 11 | 25 | 17 | 3 | 15 | 2 | 1 | 17 |
| | Resistivity [Ωcm] | 42 | 7 | 5 | 1 | 0.5 | 233 | 4 | 315 | 630 | 2 |
| | In-plane uniformity of resistivity (maximum resistivity value in the plane/minimum resistivity value in the plane) | 1.05 | 1.05 | 1.05 | 1.05 | 1.10 | 1.05 | 1.05 | 1.05 | 2.10 | 1.05 |
| | PAN resistance (O:insoluble, x:soluble) | O | O | O | O | O | O | O | O | O | O |
| | PAN etching rate (nm/min) | <10 | <10 | <10 | <10 | <10 | <10 | <10 | <10 | <10 | <10 |
| | Etching property against oxalic acid-based etching solution (O: soluble, x: insoluble) | O | O | O | O | O | O | O | O | O | O |
| | Etching rate with oxalic acid-based etching solution (nm/min) | 400 | 400 | 300 | 150 | 100 | 250 | 120 | 90 | 90 | 130 |
| | Residue after etching with oxalic acid-based etching solution (O: nil) | O | O | O | O | O | O | O | O | O | O |
| TFT characteristics | O: TFT characteristics were confirmed (*) | O | O | O | O | O | O | O | O | O | O |

(*) TFT produced by a step of etching with an oxalic acid-based etching solution and a step of etching an electrode layer on an active layer with a phosphoric acid-based etching solution (PAN).

FIG. 2
TABLE 2

|  |  | Example | | | | | | | | | |
|---|---|---|---|---|---|---|---|---|---|---|---|
|  |  | 11 | 12 | 13 | 14 | 15 | 16 | 17 | 18 | 19 | 20 |
| Film-forming conditions | Substrate temperature [°C] | 25 | 25 | 25 | 25 | 25 | 25 | 25 | 25 | 25 | 25 |
|  | Ultimate pressure [×10⁻⁴Pa] | 5 | 5 | 5 | 5 | 5 | 5 | 5 | 5 | 5 | 5 |
|  | Atmosphere gas | Ar:100% | Ar:100% | Ar:100% | Ar:100% | Ar:100% | Ar:100% | Ar:100% | Ar:100% | Ar:100% | Ar:100% |
|  | Total pressure [Pa] | 0.4 | 0.4 | 0.4 | 0.4 | 0.4 | 0.4 | 0.4 | 0.4 | 0.4 | 0.4 |
|  | Partial pressure of oxygen [×10⁻³Pa] | 0 | 0 | 0 | 0 | 0 | 0 | 0 | 0 | 0 | 0 |
| Film composition atomic ratios | In/(In+Sn+Zn) | 0.43 | 0.43 | 0.43 | 0.43 | 0.43 | 0.43 | 0.43 | 0.43 | 0.43 | 0.43 |
|  | Sn/(In+Sn+Zn) | 0.14 | 0.14 | 0.14 | 0.14 | 0.14 | 0.14 | 0.14 | 0.14 | 0.14 | 0.14 |
|  | Zn/(In+Sn+Zn) | 0.43 | 0.43 | 0.43 | 0.43 | 0.43 | 0.43 | 0.43 | 0.43 | 0.43 | 0.43 |
|  | IIIB/(In+Sn+Zn+IIIB) | 0.00 | 0.00 | 0.00 | 0.00 | 0.00 | 0.00 | 0.00 | 0.00 | 0.00 | 0.00 |
|  | IIIB group element | | | | | | | | | | |
|  | Ln/(In+Sn+Zn+Ln) | 0.03 | 0.03 | 0.03 | 0.03 | 0.03 | 0.03 | 0.03 | 0.03 | 0.03 | 0.03 |
|  | Lanthanoid series element | La | Ce | Nd | Sm | Eu | Gd | Tb | Dy | Er | Yb |
| Treatment to increase resistance |  | Atmospheric heat treatment | Atmospheric heat treatment | Atmospheric heat treatment | Atmospheric heat treatment | Atmospheric heat treatment | Atmospheric heat treatment | Atmospheric heat treatment | Atmospheric heat treatment | Atmospheric heat treatment | Atmospheric heat treatment |
|  |  | 280°C | 280°C | 280°C | 280°C | 280°C | 280°C | 280°C | 280°C | 280°C | 280°C |
|  |  | 2 hours | 2 hours | 2 hours | 2 hours | 2 hours | 2 hours | 2 hours | 2 hours | 2 hours | 2 hours |
| Properties of semiconductor thin film | Crystallinity (X-ray diffraction) | Amorphous | Amorphous | Amorphous | Amorphous | Amorphous | Amorphous | Amorphous | Amorphous | Amorphous | Amorphous |
|  | Hall measurement: Carrier concentration [cm⁻³] | $9 \times 10^{16}$ | $9 \times 10^{16}$ | $9 \times 10^{16}$ | $9 \times 10^{16}$ | $9 \times 10^{16}$ | $9 \times 10^{16}$ | $9 \times 10^{16}$ | $9 \times 10^{16}$ | $9 \times 10^{16}$ | $2.5 \times 10^{17}$ |
|  | Hall mobility [cm²/Vs] | 13 | 13 | 13 | 13 | 13 | 13 | 13 | 13 | 13 | 12 |
|  | Resistivity [Ωcm] | 5 | 5 | 5 | 5 | 5 | 5 | 5 | 5 | 5 | 2 |
|  | In-plane uniformity of resistivity (maximum resistivity value in the plane/minimum resistivity value in the plane) | 1.05 | 1.05 | 1.05 | 1.05 | 1.05 | 1.05 | 1.05 | 1.05 | 1.05 | 1.05 |
|  | PAN resistance (○:insoluble, ×:soluble) | ○ | ○ | ○ | ○ | ○ | ○ | ○ | ○ | ○ | ○ |
|  | PAN etching rate (nm/min) | <10 | <10 | <10 | <10 | <10 | <10 | <10 | <10 | <10 | <10 |
|  | Etching property against oxalic acid-based etching solution (○:soluble, ×:insoluble) | ○ | ○ | ○ | ○ | ○ | ○ | ○ | ○ | ○ | ○ |
|  | Etching rate with oxalic acid-based etching solution (nm/min) | 170 | 130 | 130 | 130 | 130 | 130 | 130 | 130 | 130 | 130 |
|  | Residue after etching with oxalic acid-based etching solution (○: nil) | ○ | ○ | ○ | ○ | ○ | ○ | ○ | ○ | ○ | ○ |
| TFT characteristics | ○: TFT characteristics were confirmed (*) | ○ | ○ | ○ | ○ | ○ | ○ | ○ | ○ | ○ | ○ |

(*) TFT produced by a step of etching with an oxalic acid-based etching solution and a step of etching an electrode layer on an active layer with a phosphoric acid-based etching solution (PAN).

FIG. 3
TABLE 3

| | | Comparative Example | | | | | | | | | |
|---|---|---|---|---|---|---|---|---|---|---|---|
| | | 1 | 2 | 3 | 4 | 5 | 6 | 7 | 8 | 9 | 10 |
| Film-forming conditions | Substrate temperature [°C] | 25 | 25 | 25 | 25 | 25 | 25 | 25 | 25 | 25 | 25 |
| | Ultimate pressure [×10⁻⁴ Pa] | 5 | 5 | 5 | 5 | 5 | 5 | 5 | 5 | 5 | 5 |
| | Atmosphere gas | Ar:100% | Ar:100% | Ar:100% | Ar:100% | Ar:100% | Ar:100% | Ar:100% | Ar:100% | Ar:96% O₂:4% | Ar:100% |
| | Total pressure [Pa] | 0.4 | 0.4 | 0.4 | 0.4 | 0.4 | 0.4 | 0.4 | 0.4 | 0.4 | 0.4 |
| | Partial pressure of oxygen [×10⁻³ Pa] | 0 | 0 | 0 | 0 | 0 | 0 | 0 | 0 | 16 | 0 |
| Film composition atomic ratios | In/(In+Sn+Zn) | 0.90 | 0.90 | 0.66 | 0.90 | 0.45 | 0.20 | 0.20 | 0.50 | 0.50 | 0.90 |
| | Sn/(In+Sn+Zn) | 0.10 | 0.10 | 0.34 | 0.00 | 0.50 | 0.50 | 0.05 | 0.00 | 0.00 | 0.10 |
| | Zn/(In+Sn+Zn) | | | | 0.10 | 0.05 | 0.30 | 0.75 | 0.50 | 0.50 | |
| | IIIB/(In+Sn+Zn+IIIB) | 0.00 | 0.00 | 0.00 | 0.00 | 0.00 | 0.00 | 0.00 | 0.33 | 0.33 | 0.00 |
| | IIIB group element | | | | | | | | Ga | Ga | |
| | Ln/(In+Sn+Zn+Ln) | 0.00 | 0.00 | 0.00 | 0.00 | 0.00 | 0.00 | 0.00 | 0.00 | 0.00 | 0.04 |
| | Lanthanoid series element | | | | | | | | | | Ce |
| Treatment to increase resistance | | Atmospheric heat treatment | Nil | Atmospheric heat treatment | Atmospheric heat treatment | Atmospheric heat treatment | Atmospheric heat treatment | Atmospheric heat treatment | Atmospheric heat treatment | Nil | Atmospheric heat treatment |
| | | 280°C | | 280°C | 280°C | 280°C | 280°C | 280°C | 280°C | | 280°C |
| | | 2 hours | | 2 hours | 2 hours | 2 hours | 2 hours | 2 hours | 2 hours | | 2 hours |
| Properties of semiconductor thin film | Crystallinity (X-ray diffraction) | Polycrystalline | Amorphous | Polycrystalline | Amorphous | Amorphous | Amorphous | Amorphous | Amorphous | Amorphous | Polycrystalline |
| | Hall measurement — Carrier concentration [cm⁻³] | 2×10²¹ | 1×10²⁰ | 1×10²⁰ | 3×10²⁰ | 8×10¹⁹ | 3×10¹⁷ | 4×10¹⁸ | 8×10¹⁶ | 1×10¹⁶ | 2×10²¹ |
| | Hall measurement — Hall mobility [cm²/Vs] | 15 | 20 | 25 | 35 | 15 | 3 | 3 | 7 | 1 | 15 |
| | Resistivity [Ωcm] | 0.00021 | 0.00315 | 0.00252 | 0.0006 | 0.005 | 7 | 53 | 11 | 630 | 0.00021 |
| | In-plane uniformity of resistivity (maximum resistivity value in the plane/minimum resistivity value in the plane) | 1.05 | 1.20 | 1.10 | 1.05 | 2.50 | 2.10 | 1.10 | 1.20 | 2.30 | 1.05 |
| | PAN resistance (○:insoluble, ×:soluble) | ○ | × | ○ | × | ○ | ○ | × | × | × | ○ |
| | PAN etching rate (nm/min) | <10 | 200 | <10 | 250 | <10 | <10 | 600 | 100 | 100 | <10 |
| | Etching property against oxalic acid-based etching solution (○: soluble, ×: insoluble) | × | ○ | × | ○ | × | × | ○ | ○ | ○ | × |
| | Etching rate with oxalic acid-based etching solution (nm/min) | <10 | 50 | <10 | 100 | <10 | <10 | 1000 | 50 | 50 | <10 |
| | Residue after etching with oxalic acid-based etching solution (○: nil) | | × | | ○ | | | ○ | ○ | ○ | |
| TFT characteristics | ○: TFT characteristics were confirmed (*) | × | × | × | ○ | × | × | × | × | × | × |

(*) TFT produced by a step of etching with an oxalic acid-based etching solution and a step of etching an electrode layer on an active layer with a phosphoric acid-based etching solution (PAN).

NONCRYSTALLINE OXIDE SEMICONDUCTOR THIN FILM, PROCESS FOR PRODUCING THE NONCRYSTALLINE OXIDE SEMICONDUCTOR THIN FILM, PROCESS FOR PRODUCING THIN-FILM TRANSISTOR, FIELD-EFFECT-TRANSISTOR, LIGHT EMITTING DEVICE, DISPLAY DEVICE, AND SPUTTERING TARGET

TECHNICAL FIELD

The invention relates to an amorphous oxide semiconductor thin film, a method of producing the same, a method of producing a thin film transistor, a field-effect type transistor, a light-emitting apparatus, a display apparatus and a sputtering target. In particular, the invention relates to an amorphous oxide semiconductor thin film which has a carrier density of less than $10^{+18}$ cm$^{-3}$, is insoluble in a phosphoric acid-based etching solution, and is soluble in an oxalic acid-based etching solution, a method of producing the same, and the like.

BACKGROUND ART

Active matrix type image display apparatuses such LCD (liquid crystal display apparatus) and an organic EL (Electro Luminescence) display apparatus have been widely used because of their display performance, energy saving, etc. Such active matrix type display apparatuses have been mainstream display apparatuses for mobile phones, PDAs (Personal Digital Assistant), personal computers, laptop personal computers, television sets, and the like. In these display apparatuses, TFT substrates are generally used.

For instance, a liquid crystal display apparatus in which a display material such as liquid crystal is filled up between a TFT substrate and an opposite substrate, and which is constituted such that power voltage is selectively applied to the display material corresponding to each pixel. Here, the TFT substrate is a substrate on which a TFT (field-effect type thin film transistor) having an active layer composed of a semiconductor thin film (alternatively called as a semiconductor film) such as an amorphous silicon thin film or a polycrystalline silicon thin film is disposed. The above-mentioned image display apparatus is driven by the active matrix circuit of TFT. TFT substrates are also called as a "TFT arrayed substrate" because the TFT substrate has generally TFTs arranged in an array shape.

In a TFT substrate used for a liquid crystal display apparatus, etc., pairs of a TFT and one pixel in the screen of a liquid crystal display apparatus, which is called one unit, are arranged on a glass substrate in lengthwise and crosswise directions. In a TFT substrate, gate wirings are arranged on a glass substrate lengthwise with an equal space and source wirings or drain wirings are arranged crosswise with an equal space, for example. Further, a gate electrode, a source electrode and a drain electrode are provided in the above-mentioned unit which constitutes each pixel, respectively.

Here, the production of a transistor using the above-mentioned silicon thin film has problems in safety and costs of equipment since the production uses a silane-based gas. Further, a TFT formed from an amorphous silicon thin film has an electron mobility of as low as about 0.5 cm$^2$/Vs and a small band gap. As a result, it may malfunction when absorbing visible light. Furthermore, production of a polycrystalline silicon thin film requires a heat treatment at a relatively high temperature so that an energy cost is expensive, and it is difficult to form the polycrystalline silicon thin film directly on a large-size glass substrate. Further, it is difficult to pattern silicon-based semiconductors by wet etching. As a result, dry etching which requires a high cost of equipment and has low productivity has to be employed.

In this connection, developments of TFTs using an oxide semiconductor thin film, which can be formed at a lower temperature and has a high electron mobility, are actively proceeded with (see Patent Documents 1 to 6, for example).

In general, the larger the overlap of the s orbit of a metal ion becomes, the higher the electron mobility of an oxide crystal. Oxide crystals of Zn, in and Sn having a larger atomic number have a high electron mobility of 0.1 to 200 cm$^2$/Vs. Further, in an oxide, oxygen and a metal ion are bonded through an ionic bond, and the chemical bond has no orientation. Therefore, even if the oxide is in an amorphous state wherein orientation of the bonds is not uniform, the oxide can have an electron mobility near that of an oxide in a crystalline state.

From this fact, a transistor having a high field-effect mobility can be produced using a metal oxide even which is amorphous, as is different from a Si-based semiconductor. Namely, by utilizing the above-mentioned properties, semiconductor devices, circuits or the like using a crystalline or amorphous metal oxide containing Zn, In and Sn are being studied.

In the technique using metal oxides, an oxide thin film containing in, Ga and Zn, or an oxide thin films containing Zn, In and Sn are being studied about their conductivity or etching properties with oxalic acid (see Non-patent Document 1 and Patent Documents 7 to 9, for example).

Also, in the technique concerning a transparent conductor film, selective etching in the case where lanthanoid elements are added is being studied (Patent Document 10).

[Patent Document 1] JP-A-2006-165527
[Patent Document 2] JP-A-H11-505377
[Patent Document 3] JP-A-S60-198861
[Patent Document 4] JP-A-2006-528843
[Patent Document 5] JP-A-2006-502597
[Patent Document 6] WO2005/088726
[Patent Document 7] JP-A-H10-83719
[Patent Document 8] JP-A-2000-256061
[Patent Document 9] JP-A-2006-210033
[Patent Document 10] JP-A-2004-240091
[Non-patent Document 1] Philosophical Magazine B,01 May, 2001 (01.05.01), Vol. 81, No. 5, pages 501-515. ORITA et al.

DISCLOSURE OF THE PRESENT INVENTION

Problems to be Solved by the Present invention

Among the oxide semiconductors which can be film-formed at a lower temperature and have a high mobility, there are ones which can be wet etched. However, an oxide semiconductor like ZnO, which can be wet etched, is also dissolved in an etching solution like PAN, which is used for preparing a metal electrode. Therefore, it was difficult to pattern an electrode on an active layer using such an oxide semiconductor by the photolithography method using wet etching. Thus, it is necessary to employ a method like the liftoff method, which includes many steps and give a lower yield, as well as by which high resolution, large scale and production in large quantities are difficult to accomplish (see Patent Documents 1 and 6). Although there is an oxide semiconductor which becomes insoluble in an etching solution used for forming a metal electrode, like PAN, by crystallization, it is difficult to wet etch the oxide semiconductor itself and the crystallization conditions are complicated. Namely, a method of forming an electrode by wet etching an oxide semiconductor itself, and forming the electrode pattern on this oxide semiconductor by wet etching, has not yet been found.

Here, the techniques disclosed in Patent Documents 8 to 10 are ones as to a transparent conductor film itself, and an application of the transparent conductor film to an active layer of a thin film transistor, possibility of giving to the transparent conductor film selective etching properties with an oxalic acid-based etching solution and a phosphoric acid-based etching solution (for example, etching properties of being insoluble in a phosphoric acid-based etching solution such as PAN (PAN-type etching solution), and being soluble in an oxalic acid-based etching solution) are not studied at all.

The invention is proposed to solve the above-mentioned problems in the prior art. An object of the invention is to provide an amorphous oxide semiconductor thin film insoluble in a phosphoric acid-based etching solution and soluble in an oxalic acid-based etching solution by adjusting the amounts of indium, tin and zinc, and a method of producing it.

Means for Solving the Problems

In order to attain the object, the amorphous oxide semiconductor thin film of the invention has a carrier density of less than $10^{+18}$ cm$^{-3}$, and is insoluble in a phosphoric acid-based etching solution and soluble in an oxalic acid-based etching solution.

By this, the amorphous oxide semiconductor thin film itself can be wet etched with an oxalic acid-based etching solution, and further, an electrode patterned can be formed on the amorphous oxide semiconductor thin film by wet etching with a phosphoric acid-based etching solution. By this, cost of production can be reduced while productivity can be increased.

Preferably, the etching rate with the phosphoric acid-based etching solution at 35° C. is less than 10 nm/min, and the etching rate with an oxalic acid-based etching solution at 35° C. is 20 nm/min or more.

By this, the selective etching properties can be demonstrated effectively, and it is possible to judge or manage the selective etching properties quantitatively.

Preferably, the amorphous oxide semiconductor thin film comprises indium, tin, zinc and oxygen, and when an atomic ratio of the number of tin atoms ([Sn]), relative to the sum of the number of indium atoms ([In]), the number of tin atoms ([Sn]) and the number of zinc atoms ([Zn]) is more than 0.1 and less than 0.2, the atomic ratio 1 below is satisfied, and when an atomic ratio of the [Sn] is 0.2 or more and less than 0.3, the atomic ratio 2 below is satisfied.

Atomic Ratio 1

$0.1<[In]/([In]+[Sn]+[Zn])<0.5$ $0.1<[Sn]/([In]+[Sn]+[Zn])<0.2$ $0.3<[Zn]/([In]+[Sn]+[Zn])<0.8$

Atomic Ratio 2

$0.01<[In]/([In]+[Sn]+[Zn])<0.3$ $0.2\leq[Sn]/([In]+[Sn]+[Zn])<0.3$ $0.4<[Zn]/([In]+[Sn]+[Zn])<0.8$ By adjusting the amounts of indium, tin and zinc, an amorphous oxide semiconductor film can be obtained which is insoluble in a phosphoric acid-based etching solution, and soluble in an oxalic acid-based etching solution.

Also, preferably, in the amorphous oxide semiconductor thin film, an atomic ratio of the [Sn] relative to the sum of the [Sn] and [Zn] is $0.1<[Sn]/([Sn]+[Zn])<0.3$.

By this, a transistor having a high on-off ratio can be produced.

Preferably, the amorphous oxide semiconductor thin film comprises a IIIB group element other than indium (at least one element selected from B, Al, Ga and Tl), and an atomic ratio of the number of atoms of the NIB group element ([IIIB]) relative to the sum of the [In], [Sn], [Zn] and [IIIB] is $0.0001<[IIIB]/([In]+[Sn]+[Zn]+[IIIB])<0.33$.

By this, the carrier density easily can be reduced. Further, the low carrier density state stabilizes so that the reliability of the transistor using the film increases.

Preferably, the amorphous oxide semiconductor thin film comprises a lanthanoid series element (at least one element selected from La, Ce, Pr, Nd, Pm, Sm, Eu, Gd, Tb, Dy, Ho, Er, Tm, Yb and Lu), and an atomic ratio of the number of atoms of the lanthanoid series element ([Ln]) relative to the sum of the [In], [Sn], [Zn] and [Ln] is $0.0001<[Ln]/([In]+[Sn]+[Zn]+[Ln])<0.1$, By this, the carrier density easily can be reduced. Further, the low carrier density state stabilizes so that the reliability of the transistor using the film increases.

Here, [ ] means the number of atoms of the element indicated in this parentheses, for instance, [Ln] indicates the number of atoms of a lanthanoid series element.

In order to attain the above-mentioned object, the method of producing an amorphous oxide semiconductor thin film of the invention is a method of producing an amorphous oxide semiconductor thin film according to any one of claims 1 to 6, which comprises steps of:

forming an amorphous oxide semiconductor thin film having a carrier density of $10^{+18}$ cm$^{-3}$ or more under a condition of the temperature of a substrate being lower than 150° C., and adjusting the carrier density to less than $10^{+18}$ cm$^{-3}$ by applying a treatment to increase resistance to the amorphous thin film.

By this, large-area uniformity is easily obtained, for example, the quality of a large-size TFT substrate can be improved.

Preferably, the above-mentioned treatment to increase resistance is a heat treatment conducted under conditions of at 150 to 650° C., for 0.5 to 12,000 minutes in the presence of oxygen.

By this, the quality and productivity of the film can be improved.

In order to attain the above-mentioned object, the method of producing a thin film transistor of the invention is the method using an amorphous oxide semiconductor thin film according to any one of claims 1 to 6, as an active layer, which comprises steps of:

forming an active layer by etching the active layer using the amorphous oxide semiconductor thin film with an etching solution containing a carboxylic acid, and forming an electrode layer by etching the electrode layer disposed upward the active layer with an etching solution containing an oxo acid.

By this, cost of production can be reduced while productivity can be increased. Further, this method is simple and excellent in an large-area uniformity and reproducibility.

In order to attain the above-mentioned object, the field-effect type transistor of the invention uses an amorphous oxide semiconductor thin film according to any one of claims 1 to 6, as an active layer.

By this, cost of production can be reduced while productivity can be increased. This field-effect type transistor has a high field-effect mobility and high reliability, and the active layer is transparent so that it can attain a high resolution.

Preferably, the amorphous oxide semiconductor thin film can be etched with an etching solution containing a carboxylic acid and an electrode etched with an etching solution containing an oxo acid can be provided on the amorphous oxide semiconductor thin film.

By this, an amorphous oxide semiconductor thin film and an electrode can be etched with an etching solution containing a carboxylic acid or an oxo acid.

The amorphous oxide semiconductor thin film has a resistance against an etching solution containing an oxo acid which normally dissolves an electrode.

As the etching solution containing a carboxylic acid, an oxalic acid-based etching solution such as ITO-06N (manufactured by Kanto Chemical Co., Inc.) may be mentioned. As the etching solution containing an oxo acid, a PAN-type etching solution may be mentioned.

The PAN-type etching solution is an etching solution containing phosphoric acid, nitric acid and acetic acid. It preferably contains phosphoric acid within a range of about 45 to 95 wt %, nitric acid within a range of about 0.5 to 5 wt %, and acetic acid within a range of about 3 to 50 wt %. The oxalic acid-based etching solution preferably contains oxalic acid in an amount of about 0.5 to 10 wt %.

The carboxylic acid is a compound having a carboxylic acid structure (R—COOH) as an acid component, and includes the following (examples):

Namely, the carboxylic acid includes lactic acid, malic acid, citric acid, oxalic acid, malonic acid, succinic acid, fumaric acid, maleic acid, aconitic acid, glutaric acid, adipic acid, an amino acid, a nitrocarboxylic acid, formic acid (methanoic acid), acetic acid (ethanoic acid), propionic acid (propanoic acid), butyric acid (butanoic acid), valeric acid (pentanoic acid), capronic acid (hexanoic acid), enanthic acid (heptanoic acid), caprylic acid (octanoic acid), pelargonic acid (nonanoic acid), capric acid (decanoic acid), lauric acid (dodecanoic acid), myristic acid (tetradecanoic acid), pentadecanoic acid, palmitic acid (hexadecanoic acid, cetanoic acid), margaric acid (heptadecanoic acid), stearic acid (octadecanoic acid), oleic acid, linoleic acid, linolenic acid, arachidonic acid, docosahexaenoic acid, eicosapentaenoic acid, benzoic acid, phthalic acid, isophthalic acid, terephthalic acid, salicylic acid, gallic acid, mellitic acid, cinnamic acid and pyruvic acid.

The oxo acid (inorganic oxo acid) includes sulfuric acid, sulfurous acid, nitric acid, nitrous acid, phosphoric acid, phosphorous acid, chromic acid, dichromic acid and permanganic acid.

Preferably, the amorphous oxide semiconductor thin film varies in the composition in the direction of film thickness and has a first region far from a gate insulating film and a second region near the gate insulating film, and the oxygen concentration of the second region is higher than the oxygen concentration of the first region.

By this, the carrier density in the vicinity of the interface of the gate insulating film can be reduced, since oxygen resides in the gate insulating film side in a larger amount. As a result, the on-off ratio of the transistor, etc. can be improved.

Preferably, the amorphous oxide semiconductor thin film varies in the composition in the direction of film thickness and has a first region far from a gate insulating film and a second region near the gate insulating film, and the Sn concentration in the second region is lower than the Sn concentration in the first region.

By this, the carrier density in the vicinity of the interface of the gate insulating film can be reduced while maintaining PAN resistance, since Sn resides in the gate insulating film side in a smaller amount. As a result, the on-off ratio of the transistor, etc. can be improved.

In order to attain the above-mentioned object, the light emitting apparatus of the invention comprises a light control element, and a field-effect type transistor according to any one of claims 10 to 13, for driving the light control element.

By this, cost of production can be reduced while productivity can be increased.

Here, the light control element includes devices using liquid crystal, and light-emitting devices using an inorganic EL or organic EL. Alternatively, the field-effect type transistor may be used as a switching device of a liquid crystal display.

Preferably, the light control element and the field-effect type transistor may be integrated.

By this, an effective production can be conducted.

In order to attain the above-mentioned object, the display apparatus of the invention uses a light emitting device according to claim 14 or 15.

By this, cost of production can be reduced while productivity can be increased.

Here, the display apparatus is an apparatus which displays images and characters.

In order to attain the above-mentioned object, the sputtering target of the invention comprises indium, tin, zinc, a IIIB group element other than indium (at least one selected from B, Al, Ga and Tl) and oxygen, wherein atomic ratios of the number of indium atoms ([In]), the number of tin atoms ([Sn]), the number of zinc atoms ([Zn]) and the number of atoms of the IIIB group element ([IIIB]) are $$0.1<[In]/([In]+[Sn]+[Zn])<0.5$$

$$0.1<[Sn]/([In]+[Sn]+[Zn])<0.2$$

$$0.3<[Zn]/([In]+[Sn]+[Zn])<0.8$$

$$0.0001<[IIIB]/([In]+[Sn]+[Zn]+[IIIB])<0.33, and$$

wherein a bulk resistance is $10^{-3}$ to $10^3$ mΩ, and a sintered density is 80% or more.

Thus, the invention provides an effective sputtering target. According to the sputtering target of the invention, an amorphous oxide semiconductor thin film capable of reducing cost of production as well as improving the productivity, etc can be produced.

In order to attain the above-mentioned object, the sputtering target of the invention comprises indium, tin, zinc, a lanthanoid series element (at least one selected from La, Ce, Pr, Nd, Pm, Sm, Eu, Gd, Tb, Dy, Ho, Er, Tm, Yb and Lu) and oxygen, wherein atomic ratios of the number of indium atoms ([In]), the number of tin atoms ([Sn]), the number of zinc atoms ([Zn]) and the number of the lanthanoid series atoms ([Ln]) are $$0.1<[In]/([In]+[Sn]+[Zn])<0.5$$

$$0.1<[Sn]/([In]+[Sn]+[Zn])<0.2$$

$$0.3<[Zn]/([In]+[Sn]+[Zn])<0.8$$

$$0.0001<[Ln]/([In]+[Sn]+[Zn]+[Ln])<0.1, and$$

wherein a bulk resistance is $10^{-3}$ to $10^3$ mΩ, and a sintered density is 80% or more.

Thus, the invention provides an effective sputtering target. According to the sputtering target of the invention, an amorphous oxide semiconductor thin film capable of reducing cost of production as well as improving the productivity, etc can be produced.

BRIEF DESCRIPTION OF THE DRAWINGS

FIG. 1 is Table 1 indicating film-forming conditions, film composition atomic ratios, treatments to increase resistance, properties of semiconductor thin films, and TFT characteristics for Examples 1 to 10.

FIG. 2 is Table 2 indicating film-forming conditions, film composition atomic ratios, treatments to increase resistance, properties of semiconductor thin films, and TFT characteristics for Examples 11 to 20.

FIG. 3 is Table 3 indicating film-forming conditions, film composition atomic ratios, treatments to increase resistance, properties of semiconductor thin films, and TFT characteristics for Comparative Examples 1 to 10.

BEST MODE FOR CARRYING OUT THE PRESENT INVENTION

Figure 4:
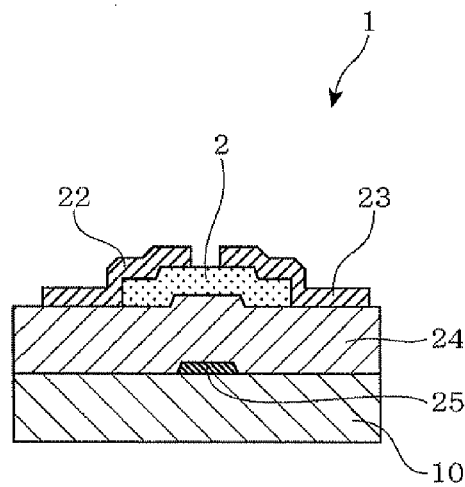
FIG. 4 is a schematic cross-sectional view showing essential parts of the bottom-gate type thin film transistor formed on an insulating substrate according to one embodiment of the invention.

Hereinafter, an explanation is made on preferred embodiments of the amorphous oxide semiconductor thin film, method of preparing thereof, method of producing a thin film transistor, field-effect type transistor, image display apparatus and sputtering target of the invention.

[One Embodiment of Amorphous Oxide Semiconductor Thin Film]

The amorphous oxide semiconductor thin film according to one embodiment of the invention has a carrier density of less than $10^{+18}$ cm$^{-3}$, is insoluble in a phosphoric acid-based etching solution and is soluble in an oxalic acid-based etching solution, by optimizing the amounts of indium, tin and zinc. By this, the amorphous oxide semiconductor thin film itself can be wet etched with an oxalic acid-based etching solution, further wet etched with a phosphoric acid-based etching solution to form an electrode pattern on the amorphous oxide semiconductor thin film.

The carrier density of the amorphous oxide semiconductor thin film is preferably less than $10^{18}$ cm$^{-3}$ at around room temperature (for example, 0 to 40° C.), more preferably less than $2 \times 10^{17}$ cm$^{-3}$, further preferably less than $10^{17}$ cm$^{-3}$, and particularly preferably less than $5 \times 10^{18}$ cm$^{-3}$.

The reason therefor is that if the carrier density is $10^{18}$ cm$^{-3}$ or more, it may not be driven as a TFT. Alternatively, even if it operates as a TFT, it may be in a normally-on state, a threshold voltage may be higher, an on-off ratio may be smaller, or leakage current may increase.

The amorphous oxide semiconductor thin film is insoluble in a phosphoric acid-based etching solution and soluble in an oxalic acid-based etching solution. Therefore, a thin film transistor can be produced from the amorphous oxide semiconductor thin film by simple wet etching. Namely, it is unnecessary to employ dry etching which requires high equipment cost, has a low etching rate and causes the problem of depositions, or liftoff which has complicated steps, gives lower yield and is difficult to make high-resolution, large dimension and mass production. Thus, a cost of production can be lowered while the productivity and the like can be improved.

As the phosphoric acid-based etching solution, a PAN-type etching solution is normally used. The PAN-type etching solution is an etching solution containing phosphoric acid, nitric acid and acetic acid. The concentration of phosphoric acid is preferably within a range of about 20 to 95 wt %, nitric acid within a range of about 0.5 to 5 wt %, and acetic acid within a range of about 3 to 50 wt %. The temperature of the solution is preferably about 20 to 50° C.

The oxalic acid-based etching solution preferably contains oxalic acid in the concentration of about 0.5 to 10 wt %. The temperature of the solution is preferably 20 to 50° C.

The "amorphous" in the above-mentioned amorphous oxide semiconductor thin film means that a halo pattern is observed in the X-ray diffraction and no specific diffraction line is observed. It contains the case where fine crystals are found in an amorphous substance by observation with TEM (transmission electron microscope) or the like. However, such fine crystals are preferably contained in an amorphous substance in a small amount or nil, since they may be residues at the time of etching.

The resistivity of the amorphous oxide semiconductor thin film is normally $10^{-2}$ to $10^8$ Ωcm. The reason therefor is that if the resistivity is less than $10^{-2}$ Ωcm, the film may not operate as a semiconductor thin film because an electric current easily flows. On the other hand, if the resistivity is larger than $10^8$ Ωcm, the film may operate as a semiconductor only when applying it strong electric field. To avoid such problems effectively, the resistivity is preferably about $10^{-1}$ to $10^7$ Ωcm, more preferably 1 to $10^6$ Ωcm, particularly preferably 10 to $10^5$ Ωcm.

The crystallization temperature of the amorphous oxide semiconductor thin film is preferably higher than 280° C., more preferably higher than 300° C., further preferably higher than 350° C., and particularly preferably higher than 400° C. The reason therefor is that if the crystallization temperature is 280° C. or lower, crystallization may occur during a treatment to increase resistance for decreasing carrier density. As a result, an oxalic acid etching rate may decrease, or etching residues may be brought about.

Preferably, an etching rate in a phosphoric acid-based etching solution at 35° C. is less than 10 nm/min, and an etching rate in an oxalic acid-based etching solution at 35° C. is 20 nm/min or more. By this, selective etching performance can be effectively demonstrated. Here, in the case of the etching rate in a phosphoric acid-based etching solution at 35° C. being less than 10 nm/min, it may be judged that the film is insoluble in a phosphoric acid-based etching solution. On the other hand, in the case of the etching rate in an oxalic acid-based etching solution at 35° C. being 20 nm/min or more, it may be judged that the film is soluble in an oxalic acid-based etching solution. According to these judgments, selective etching performance can be quantitatively judged or controlled.

The etching rate in a phosphoric acid-based etching solution at 35° C. is more preferably less than 5 nm/min, and further preferably 2 nm/min.

The etching rate in an oxalic acid-based etching solution at 35° C. is more preferably 50 nm/min or more, further preferably 80 nm/min or more, and particularly preferably 120 nm/min or more. However, there is an upper limit of the etching rate in an oxalic acid-based etching solution. The upper limit of the etching rate in an oxalic acid-based etching solution at 35° C. is preferably 800 nm/min or less, more preferably 500 nm/min or less, and further preferably 400 nm/min or less. The reason therefor is that if it is 800 nm/min or more, control of etching accuracy may become difficult. As a result, a degree of variation may be larger, or chemical resistance may decrease.

The amorphous oxide semiconductor thin film of this embodiment comprises indium, tin, zinc and oxygen, and when an atomic ratio of the number of tin atoms ([Sn]), relative to the sum of the number of indium atoms ([In]), the number of tin atoms ([Sn]) and the number of zinc atoms ([Zn]) is more than 0.1 and less than 0.2, the atomic ratio 1 below is satisfied, and when the atomic ratio of the [Sn] is 0.2 or more and less than 0.3, the atomic ratio 2 below is satisfied.

Atomic Ratio 1

$$0.1<[In]/([In]+[Sn]+[Zn])<0.5$$

$$0.1<[Sn]/([In]+[Sn]+[Zn])<0.2$$

$$0.3<[Zn]/([In]+[Sn]+[Zn])<0.8$$

Atomic Ratio 2

$$0.01<[In]/([In]+[Sn]+[Zn])<0.3$$

$$0.2\leq[Sn]/([In]+[Sn]+[Zn])<0.3$$

$$0.4<[Zn]/([In]+[Sn]+[Zn])<0.8$$

In the above atomic ratio 1, [In]/([In]+[Sn]+[Zn]) is preferably 0.1 to 0.5, more preferably 0.18 to 0.48, further preferably 0.2 to 0.45. The reason therefor is that when the ratio is less than 0.1, mobility of the film when a transistor is constituted may be smaller. Also, variation in the ratio of zinc/tin (which means variation in a [Zn]/[Sn] ratio) affects the transistor characteristics remarkably, so that the transistor characteristics may not be uniform in a large area. Further, the resistance of a target may increase, as a result, film-forming by the DC sputtering may become difficult. On the other hand, if it is larger than 0.5, carrier electrons easily generate, whereby the film comes to have a low resistance. As a result, when a transistor is constituted of the film, the transistor may be in a normally-on state, an on-off ratio may be smaller, or crystallization may be apt to occur. Here, if crystallization occurs, an etching rate in an oxalic acid-based etching solution may decrease, or residues may be left after etching.

In the above atomic ratio 1, [Sn]/([In]+[Sn]+[Zn]) is preferably 0.1 to 0.2, more preferably 0.1 to 0.19, further preferably 0.11 to 0.19, and particularly preferably 0.11 to 0.18, The reason therefor is that if the ratio is less than 0.1, the PAN resistance may be lost. On the other hand, the ratio is larger than 0.2, an etching properties with oxalic acid may be lost, or the in-plane uniformity may decrease. Further, the resistance of a target becomes higher so that the DC sputtering may not be conducted.

In the above atomic ratio 1, [Zn]/([In]+[Sn]+[Zn]) is preferably 0.3 to 0.8, more preferably 0.35 to 0.75, and further preferably 0.4 to 0.7. The reason therefor is that if the ratio is less than 0.3, an etching property with oxalic acid may be lost. On the other hand, the ratio is larger than 0.8, the PAN resistance, heat resistance or in-plane uniformity may be lost, or crystallization may be apt to occur. Here, if the crystallization occurs, an etching rate in an oxalic acid-based etching solution may decrease, or residues may be left after etching. Further, a film-forming rate during sputtering may decrease.

In the above atomic ratio 2, [In]/([In]+[Sn]+[Zn]) is preferably 0.01 to 0.3, more preferably 0.05 to 0.25, and further preferably 0.1 to 0.23. The reason therefor is that if the ratio is less than 0.1, mobility of the film at the time when a transistor is constituted may be smaller. Also, variation in the ratio of zinc/tin (which means variation in [Zn]/[Sn] ratio) affects the transistor characteristics remarkably, so that the transistor characteristics may not be uniform in a large area. Further, the resistance of a target may increase and film-forming with the DC sputtering may become difficult. On the other hand, if the ratio is larger than 0.3, carrier electrons are apt to generate, whereby the film comes to have a low resistance. As a result, when a transistor is constituted of the film, it may be in a normally-on state, an on-off ratio may be smaller, or crystallization may be apt to occur. Here, if the crystallization occurs, an etching rate with an oxalic acid-based etching solution may decrease, or residues may be left after etching.

In the above atomic ratio 2, [Sn]/([In]+[Sn]+[Zn]) is preferably 0.2 or more and less than 0.3, more preferably 0.21 to 0.29, and further preferably 0.22 to 0.28. The reason therefor is that if the ratio is smaller than 0.2, the PAN resistance may be lost. On the other hand, if the ratio is larger than 0.3, etching properties with oxalic acid may be lost, or in-plane uniformity may decrease. Further, the resistance of a target may increase so that the DC sputtering may not be conducted.

In the above atomic ratio 2, [Zn]/([In]+[Sn]+[Zn]) is preferably 0.4 to 0.8, more preferably 0.45 to 0.75, and further preferably 0.5 to 0.7. The reason therefor is that if the ratio is less than 0.4, etching properties with oxalic acid may be lost. On the other hand, if the ratio is larger than 0.8, the PAN resistance, heat resistance or in-plane uniformity may be lost, or crystallization may be apt to occur. If the crystallization occurs, an etching rate with an oxalic acid-based etching solution may decrease, or residues may be left after etching. Further, the film-forming rate during sputtering may decrease.

By adjusting the amounts of indium, tin and zinc to the atomic ratio 1 or 2, an amorphous oxide semiconductor thin film can be obtained which is insoluble in a phosphoric acid-based etching solution and soluble in an oxalic acid-based etching solution.

Here, the atomic ratio of the above-mentioned [Sn] relative to the sum of the above-mentioned [Sn] and [Zn] is preferably $0.1<[Sn]/([Sn]+[Zn])<0.3$. Namely, [Sn]/[Sn]+[Zn]) is preferably 0.1 to 0.3, more preferably 0.11 to 0.29, further preferably 0.13 to 0.27, and particularly preferably 0.15 to 0.25. The reason therefor is that if the ratio is less than 0.1, the PAN resistance may be lost. On the other hand, if the ratio is larger than 0.3, etching properties with oxalic acid may be lost. Further, tin has the effect of giving PAN resistance to the film without decrease of mobility. However, if the ratio of tin relative to zinc is too large, the carrier density may not be decreased, even when a treatment to increase resistance is applied to the film. Therefore, in order to produce a transistor having a high on-off ratio, it is preferred that the ratio of tin and zinc is maintained in the proper values. Further, if the ratio deviates from the above-mentioned range, resistance of a sintered target used for the sputtering may increase.

Preferably, the amorphous oxide semiconductor thin film of this embodiment comprises a IIIB group element other than indium (at least one selected from B, Al, Ga and Tl), and an atomic ratio of the number of atoms of the IIIB group element ([IIIB]) relative to the sum of the [In], [Sn], [Zn] and [IIIB] is $$0.0001 < [IIIB]/([In]+[Sn]+[Zn]+[IIIB]) < 0.33.$$

Namely, $[IIIB]/([In]+[Sn]+[Zn]+[IIIB])$ is normally 0.0001 to 0.5, preferably 0.001 to 0.33, more preferably 0.01 to 0.25, further preferably 0.03 to 0.2, and particularly preferably 0.05 to 0.15. The reason therefor is that if the ratio is less than 0.0001, the effect may not be expected. On the other hand, if the ratio is larger than 0.5, the mobility of the film at the time when a transistor is constituted may decrease, or an etching rate with oxalic acid may decrease.

As seen above, if the film contains a IIIB group element other than In, it is easy to reduce the carrier density. Further, the state of a lower carrier density stabilizes, as a result, reliability of the film at the time when a transistor is constituted increases. The reason therefor is considered that a IIIB group element other than In binds oxygen more strongly than In, so that carrier generation is difficult to occur because of lack of oxygen.

Of the above-mentioned IIIB group elements, B, Al and Ga which have an atomic number smaller than that of In are preferably, since the lower carrier density state stabilizes.

The atomic ratio of the above-mentioned [In] relative to the sum of the above-mentioned [In] and [IIIB] is preferably $0.5<[In]/([In]+[IIIB])$.

Namely, $[In]/([In]+[IIIB])$ is preferably larger than 0.5, more preferably larger than 0.6, and further preferably larger than 0.7. The reason therefor is that if the ratio is 0.5 or less, mobility of the transistor may decrease.

Preferably, the amorphous oxide semiconductor thin film of this embodiment comprises a lanthanoid series element (at least one selected from La, Ce, Pr, Nd, Pm, Sm, Eu, Gd, Tb, Dy, Ho, Er, Tm, Yb and Lu), and an atomic ratio of the number of atoms of the lanthanoid series element ([Ln]) relative to the sum of the [In], [Sn], [Zn] and [Ln] is $$0.0001 < [Ln]/([In]+[Sn]+[Zn]+[Ln]) < 0.1.$$

Namely, $[Ln]/([In]+[Sn]+[Zn]+[Ln])$ is preferably 0.0001 to 0.1, more preferably 0.001 to 0.09, and further preferably 0.01 to 0.08. The reason therefor is that if the ratio is less than 0.0001, the effect mentioned below may not be expected. On the other hand, if the ratio is larger than 0.1, mobility of the film at the time when a transistor is constituted may decrease.

By this, it becomes easily to decrease a carrier density. The lower carrier density state stabilizes, as a result, reliability of the film at the time when a transistor is constituted increases. Also, by containing the above-mentioned lanthanoid series element in the film, the resistance of the amorphous film easily stabilizes, as a result, reliability of the film at the time when a transistor is constituted increases.

As the lanthanoid series elements, preferred are La, Ce, Pr, Nd, Pm, Sm, Eu, Gd, Tb, Dy, Ho, Er, Tm and Yb, and more preferred are Sm, Eu, Gd, Tb, Dy, Ho, Er, Tm and Yb because decrease in the mobility is smaller.

As explained above, by using the amorphous oxide semiconductor thin film of this embodiment, the amorphous oxide semiconductor thin film itself is wet etched with an oxalic acid-based etching solution, followed by wet etching with a phosphoric acid-based etching solution to form a electrode pattern on this amorphous oxide semiconductor thin film. Thus, a cost of production can be lowered while the productivity and the like can be improved.

[One Embodiment of Method of Producing Amorphous Oxide Semiconductor Thin Film]

The method of producing an amorphous oxide semiconductor thin film according to one embodiment of the invention comprises steps of: forming an amorphous oxide semiconductor thin film having a carrier density of $10^{+18}$ cm$^{-3}$ or more under a condition of the temperature of a substrate being lower than 150° C. as the amorphous oxide semiconductor thin film, and adjusting the carrier density to less than $10^{+18}$ cm$^{-3}$ by applying a treatment to increase resistance to the amorphous thin film.

Physical film-forming methods are normally used for forming the above-mentioned film. The physical film-forming methods include the sputtering method, the vapor vacuum deposition method, the ion plating method, the pulse laser deposition method, etc. Industrially, the sputtering method is preferred in view of high mass-production.

The sputtering method includes the DC sputtering method, the RF sputtering method, the AC sputtering method, the ECR sputtering method, and the opposite target sputtering method. Of these, preferred are the DC sputtering method and the AC sputtering method which give high industrial production and wherein carrier concentration can be decreased more easily than the RF sputtering method. Alternatively, to control a deterioration in the quality of the interface by film-forming, to reduce leakage current, or to improve the properties of the transparent semiconductor thin film such as an on-off ratio, the ECR sputtering method and the opposite target sputtering method are preferred, which are easy to control in the film quality.

The substrate-target distance (S-T distance) during sputtering is normally 150 mm or less, preferably 110 mm, with 80 mm or less being particularly preferable. The reason therefor is that if the S-T distance is too short, activation of a positive divalent element can be expected since the substrate is exposed to plasma during sputtering. If the S-T distance is longer than 150 mm, the film-forming speed becomes too slow to be industrially applicable.

The substrate temperature at the time of film-forming is preferably lower than 150° C., more preferably lower than 100° C., and further preferably lower than 50° C. The reason therefor is that if the substrate temperature is 150° C. or higher, it may become difficult to decrease carrier density by a treatment to increase resistance.

Subsequently, a treatment to increase resistance is applied to the amorphous thin film formed as in the above manner. As the treatment to increase resistance, a heat treatment in the presence of oxygen, a plasma treatment, an ozone treatment, a steam treatment, RTA or the like may be used.

The carrier density after conducting the treatment to increase resistance is preferably less than $10^{+18}$ cm$^{-3}$, more preferably less than $2\times10^{+17}$ cm$^{-3}$, and further preferably less than $10^{+17}$ cm$^{-3}$. By this, a semiconductor device using the amorphous oxide semiconductor thin film is further improved in its reliability and performance (for example, TFT characteristics such as normally-off characteristics).

Preferably, the above-mentioned treatment to increase resistance is a heat treatment carrying out under conditions at a temperature of 150 to 650° C. for 0.5 to 12,000 minutes in the presence of oxygen. By employing these conditions, the quality and productivity can be improved. The reason for the temperature range is that if the temperature of the heat treatment is lower than 150° C., the effect of the treatment may not be exhibited, or too long time may be needed. On the other hand, if the temperature is higher than 650° C., energy cost may be higher, the tact time may be longer, the threshold voltage of the TFT produced from the film may be larger, or the substrate may deform. In order to avoid these problems effectively, the treatment temperature is preferably 180 to 450° C., more preferably 190 to 390° C., further preferably 200 to 350° C., and particularly preferably 210 to 290° C.

The reason for the above-mentioned heat treatment time is that if the time is shorter than 0.5 minute, the treatment may be insufficient to heat inside of the film because heat time is too short. On the other hand, if the time is longer than 12,000 minutes, the scale of a treatment apparatus may become too large to use it industrially, or a substrate may be damaged and deformed during the treatment. To avoid these problems effectively, the treatment time is preferably 1 to 600 minutes, more preferably 5 to 360 minutes, further preferably 15 to 240 minutes, and particularly preferably 30 to 120 minutes.

Further, the difference between the substrate temperature during film-forming and the temperature in a treatment to increase resistance is preferably 50° C. or more, more preferably 150° C. or more, and particularly preferably 250° C. or more. The reason therefor is that if the temperature difference is less than 50° C., sufficient effects of the treatment to increase resistance may not be obtained so that the carrier density may not decrease.

As explained above, according to the method of producing an amorphous oxide semiconductor thin film of this embodiment, the problems such as the in-plane uniformity being deteriorated owing to the plasma distribution during film-forming, or the like can be avoided, since the carrier density is not adjusted by oxygen partial pressure during the thin film-forming. Thus, an large-area uniformity can be readily obtained, and for instance, the quality of a large-size TFT substrate can be improved.

Next, Examples 1 to 20 and Comparative Examples 1 to 10 which relate to one embodiment of the amorphous oxide semiconductor thin film and one embodiment of the method of producing it will be explained with reference to the drawings.

FIG. 1 is Table 1 indicating the conditions for the film-forming, the film composition atomic ratios, the treatment to increase resistance, the properties of semiconductor thin film and the TFT characteristics for Examples 1 to 10.

FIG. 2 is Table 2 describes the conditions for forming a film, the film composition atomic ratios, the treatment to increase resistance, the properties of semiconductor thin film and the TFT characteristics for Examples 11 to 20.

FIG. 3 is Table 3 describes the conditions for forming a film, the film composition atomic ratios, the treatment to increase resistance, the properties of semiconductor thin film and the TFT characteristics for Comparative Examples 1 to 10.

EXAMPLE 1

(1) Production and Evaluation of Sputtering Target
1. Production of Target

As the raw materials, indium oxide powder, tin oxide powder and zinc oxide powder were mixed such that $[In]/([In]+[Sn]+[Zn])$ was 0.20, $[Sn]/([In]+[Sn]+[Zn])$ was 0.15, and $[Zn]/([In]+[Sn]+[Zn])$ was 0.65. The mixture was then supplied to a wet ball mill and mixed and pulverized for about 72 hours, whereby raw material fine powder was obtained.

After granulating the raw material fine powders, the raw material fine powder was press-molded to have a diameter of 10 cm and a thickness of 5 mm. The molded product was put in a firing furnace, and firing was performed at 1400° C. for 48 hours to obtain a sintered body (target). The heating rate was 3° C./min.

2. Evaluation of Target

For the resulting target, the density and the bulk resistance were measured. As a result, it was found that the theoretical relative density was 98% and the bulk resistance value measured by the four probe method was 80 mΩ.

(2) Formation of Transparent Semiconductor Thin Film

The sputtering target obtained in (1) above was installed in the film-forming apparatus of the RF magnetron sputtering method, which is one of the sputtering methods. Then, a transparent conductor film was formed on a glass substrate (Corning 1737).

The sputtering conditions were as follows. Substrate temperature: 25° C., ultimate pressure: $5 \times 10^{-4}$ Pa, atmosphere gas: Ar 100%, sputtering pressure (total pressure): $4 \times 10^{-1}$ Pa, input power: 100 W, and film-forming time: 20 minutes and S-T distance: 95 mm.

As a result, a transparent conductive oxide film was formed on the glass substrate with a film thickness of about 100 nm, to obtain a transparent conductive glass.

The film composition was analyzed by the ICP method, and it was found that the $[In]/([In]+[Sn]+[Zn])$ was 0.20, the $[Sn]/([In]+[Sn]+[Zn])$ was 0.15, and the $[Zn]/([In]+[Sn]+[Zn])$ was 0.65.

(3) Treatment to Increase Resistance of Transparent Semiconductor Thin Film

The transparent conductor thin film obtained in (2) above was subjected to a treatment to increase resistance. As the treatment to increase resistance, an oxidation treatment was conducted by heating at 280° C. for 2 hours in atmosphere (in the presence of oxygen) (heat treatment in atmosphere).

(4) Property Evaluation of Transparent Semiconductor Thin Film

The carrier concentration and the hall mobility of the transparent semiconductor thin film obtained in (3) above were measured by a hall measurement apparatus. The carrier concentration was $5 \times 10^{16}$ cm$^{-3}$ and the Hall mobility was 3 cm$^2$/Vs. The resistivity was 42 Ωcm. The in-plane uniformity of resistivity (maximum resistivity value in the plane/minimum resistivity value in the plane) was 1.05.

The Hall measurement apparatus and the Hall measurement conditions are as follows.

[Hall Measurement Apparatus]
Resi Test 8310: manufactured by Toyo Corporation
[Measurement Conditions]
Room temperature (25° C.), 0.5 [T], $10^{-4}$ to $10^{-12}$ A, AC magnetic field hall measurement In addition, as a result of measurement by means of a spectrophotometer, it was found that this transparent conductive oxide had a light transmittance for light with a wavelength of 400 nm of 85% or more, which means the transparent conductive oxide was excellent in transparency. It was confirmed by X-ray crystal structure analysis that the transparent conductive oxide was amouphous.

The PAN resistance, the oxalic acid etching rate and the like were evaluated and indicated in the above-mentioned table.

[PAN Resistance]

Films which exhibited a PAN etching rate of 10 nm/min or more was indicated as poor and other films were indicated as good. Here, the evaluation of PAN resistance was conducted by using a PAN-type etching solution of 35° C. (phosphoric acid: 91.4 wt %, nitric acid: 3.3 wt % and acetic acid: 5.3 wt %). Meanwhile, as a PAN-type etching solution (containing phosphoric acid, nitric acid and acetic acid), one containing 20 to 95 wt % of phosphoric acid, 0.5 to 5 wt % of nitric acid and 3 to 50 wt % of acetic acid is normally used.

The etching rate with the above-mentioned PAN (PAN-type etching solution) of the amorphous oxide semiconductor thin film of Example 1 was less than 10 nm/min, and the evaluation was good (insoluble).

[Etching Rate by Oxalic Acid Etching Solution]

Films which exhibited an etching rate with an oxalic acid-based etching solution of 20 nm/min or more was indicated as good and other films were indicated as poor. The etching rate was measured by using ITO-06N (Kanto Chemical Co., Inc.)

at 35° C. as an oxalic acid-based etching solution. Further, after conducting 150% overetching, it was confirmed by observation with a microscope whether there were etching residues.

The amorphous oxide semiconductor thin film of Example 1, had an etching rate with the oxalic acid-based etching solution of 400 nm/min, and evaluated good (soluble). The evaluation of etching residues after etching with the oxalic acid-based etching solution was good (no residue).

EXAMPLE 2

The amorphous oxide semiconductor thin film of Example 2 was produced in about the same manner as in Example 1 (film-forming conditions, film composition atomic ratios and treatment to increase resistance). The film composition was analyzed by the ICP method to find that the [In]/([In]+[Sn]+[Zn]) was 0.31, the [Sn]/([In]+[Sn]+[Zn]) was 0.11 and the [Zn]/([In]+[Sn]+[Zn]) was 0.59.

The oxide semiconductor thin film produced under the above-mentioned production conditions has the properties as indicated in FIG. 1. It was found that the crystallinity was amorphous, the carrier concentration was $9 \times 10^{16}$ cm$^{-3}$, and the Hall mobility was 10 cm$^2$/Vs. The resistivity measured by the four probe method was 7 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 400 nm/min, and the evaluation was good (soluble). The residues after the oxalic acid-based etching were evaluated as good (no residue).

EXAMPLE 3

The amorphous oxide semiconductor thin film of Example 3 was produced in about the same manner as in Example 1 (film-forming conditions, film composition atomic ratios and treatment to increase resistance). The film composition was analyzed by the ICP method to find that the [In]/[In]+[Sn]+[Zn]) was 0.31, the [Sn]/([In]+[Sn]+[Zn]) was 0.15, and the [Zn]/[In]+[Sn]+[Zn]) was 0.54.

The oxide semiconductor thin film produced under the above-mentioned production conditions has the properties as indicated in FIG. 1. It was found that the crystallinity was amorphous, the carrier concentration was $1.2 \times 10^{17}$ cm$^{-3}$, and the Hall mobility was 11 cm$^2$/Vs. The resistivity measured by the four probe method was 5 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 300 nm/min, and the evaluation was good (soluble). The residues after the oxalic acid-based etching were evaluated as good (no residue).

EXAMPLE 4

The amorphous oxide semiconductor thin film of Example 4 was produced in about the same manner as in Example 1 (film-forming conditions, film composition atomic ratios and treatment to increase resistance). The film composition was analyzed by the ICP method to find that the [In]/([In]+[Sn]+[Zn]) was 0.43, the [Sn]/([In]+[Sn]+[Zn]) was 0.14, and the [Zn]/([In]+[Sn]+[Zn]) was 0.43.

The oxide semiconductor thin film produced under the above-mentioned production conditions has the properties as indicated in FIG. 1. It was found that the crystallinity was amorphous, the carrier concentration was $5 \times 10^{17}$ cm$^{-3}$, and the Hall mobility was 25 cm$^2$/Vs. The resistivity measured by the four probe method was 1 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 150 nm/min, and the evaluation was good (soluble). The residues after the oxalic acid-based etching were evaluated as good (no residue).

EXAMPLE 5

The amorphous oxide semiconductor thin film of Example 5 was produced in about the same manner as in Example 1 (film-forming conditions, film composition atomic ratios and treatment to increase resistance). The film composition was analyzed by the ICP method to find that the [In]/([In]+[Sn]+[Zn]) was 0.20, the [Sn]/([In]+[Sn]+[Zn]) was 0.23, and the [Zn]/([In]+[Sn]+[Zn]) was 0.57.

The oxide semiconductor thin film produced under the above-mentioned production conditions has the properties as indicated in FIG. 1. It was found that the crystallinity was amorphous, the carrier concentration was $8 \times 10^{17}$ cm$^{-3}$, and the Hall mobility was 17 cm$^2$/Vs. The resistivity measured by the four probe method was 0.5 Ωcm. The in-plane uniformity of resistivity (maximum resistivity value in the plane/minimum resistivity value in the plane) was 1.10, The etching rate with the PAN etching solution was less than 10 nm/min, and the evaluation was good (insoluble). The etching rate with the oxalic acid-based etching solution was 100 nm/min, and the evaluation was good (soluble). The residues after the oxalic acid-based etching were evaluated as good (no residue).

EXAMPLE 6

The amorphous oxide semiconductor thin film of Example 6 was produced in about the same manner as in Example 1 (film-forming conditions, film composition atomic ratios and treatment to increase resistance) except that Ga belonging to the IIIB group was contained. The film composition was analyzed by the ICP method to find that the [Ga]/([In]+[Sn]+[Zn]+[Ga]) was 0.10.

The oxide semiconductor thin film produced under the above-mentioned production conditions has the properties as indicated in FIG. 1. It was found that the crystallinity was amorphous, the carrier concentration was $9 \times 10^{15}$ cm$^{-3}$, and the Hall mobility was 3 cm$^2$/Vs. The resistivity measured by the four probe method was 233 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 250 nm/min, and the evaluation was good (soluble). The residues after the oxalic acid-based etching were evaluated as good (no residue).

EXAMPLE 7

The amorphous oxide semiconductor thin film of Example 7 was produced in about the same manner as in Example 4 (film-forming conditions, film composition atomic ratios and treatment to increase resistance) except that Ga belonging to the IIIB group was contained. The film composition was analyzed by the ICP method to find that the [Ga]/([In]+[Sn]+[Zn]+[Ga]) was 0.10.

The oxide semiconductor thin film produced under the above-mentioned production conditions has the properties as indicated in FIG. 1. It was found that the crystallinity was amorphous, the carrier concentration was $1\times10^{17}$ cm$^{-3}$, and the Hall mobility was 15 cm$^2$/Vs. The resistivity measured by the four probe method was 4 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 120 nm/min, and the evaluation was good (soluble). The residues after the oxalic acid-based etching were evaluated as good (no residue).

EXAMPLE 8

The amorphous oxide semiconductor thin film of Example 8 was produced in about the same manner as in Example 7 (film-forming conditions, film composition atomic ratios and treatment to increase resistance). The film composition was analyzed by the ICP method to find that the [Ga]/([In]+[Sn]+[Zn]+[Ga]) was 0.20.

The oxide semiconductor thin film produced under the above-mentioned production conditions has the properties as indicated in FIG. 1. It was found that the crystallinity was amorphous, the carrier concentration was $1\times10^{16}$ cm$^{-3}$, and the Hall mobility was 2 cm$^2$/Vs. The resistivity measured by the four probe method was 315 Ωcm, The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 90 nm/min, and the evaluation was good (soluble). The residues after the oxalic acid-based etching were evaluated as good (no residue).

EXAMPLE 9

The amorphous oxide semiconductor thin film of Example 9 was produced in about the same manner as in Example 8 (film-forming conditions, film composition atomic ratios and treatment to increase resistance) except that in the sputtering conditions, the atmosphere gas was changed to Ar 96 vol %+O$_2$ 4 vol % and the partial pressure of oxygen was changed to $16\times10^{-3}$ Pa, and the treatment to increase resistance was not conducted.

The oxide semiconductor thin film produced under the above-mentioned production conditions has the properties as indicated in FIG. 1. It was found that the crystallinity was amorphous, the carrier concentration was $1\times10^{16}$ cm$^{-3}$, and the Hall mobility was 1 cm$^2$/Vs. The resistivity measured by the four probe method was 630 Ωcm. The in-plane uniformity of resistivity (maximum resistivity value in the plane/minimum resistivity value in the plane) was 2.10. The etching rate with the PAN etching solution was less than 10 nm/min, and the evaluation was good (insoluble). The etching rate with the oxalic acid-based etching solution was 90 nm/min, and the evaluation was good (soluble). The residues after the oxalic acid-based etching were evaluated as good (no residue).

Here, Example 9 is an example in which the resistance was increased by partial pressure of oxygen during film-forming in place of the treatment to increase resistance. As a result, the in-plane uniformity of resistivity was inferior to those of other examples.

EXAMPLE 10

The amorphous oxide semiconductor thin film of Example 10 was produced in about the same manner as in Example 7 (film-forming conditions, film composition atomic ratios and treatment to increase resistance) except that Al was contained in place of Ga. The film composition was analyzed by the ICP method to find that the [Al]/([In]+[Sn]+[Zn]+[Al]) was 0.10.

The oxide semiconductor thin film produced under the above-mentioned production conditions has the properties as indicated in FIG. 1. It was found that the crystallinity was amorphous, the carrier concentration was $2\times10^{17}$ cm$^{-3}$, and the Hall mobility was 17 cm$^2$/Vs. The resistivity measured by the four probe method was 5 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 130 nm/min, and the evaluation was good (soluble). The residues after the oxalic acid-based etching were evaluated as good (no residue).

EXAMPLE 11

The amorphous oxide semiconductor thin film of Example 11 was produced in about the same manner as in Example 4 (film-forming conditions, film composition atomic ratios and treatment to increase resistance) except that La belonging to lanthanoids was contained. The film composition was analyzed by the ICP method to find that the [La]/([In]+[Sn]+[Zn]+[La]) was 0.03.

The oxide semiconductor thin film produced under the above-mentioned production conditions has the properties as indicated in FIG. 2. It was found that the crystallinity was amorphous, the carrier concentration was $9\times10^{15}$ cm$^{-3}$, and the Hall mobility was 13 cm$^2$/Vs. The resistivity measured by the four probe method was 5 Ωcm, The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 170 nm/min, and the evaluation was good (soluble). The residues after the oxalic acid-based etching were evaluated as good (no residue).

EXAMPLE 12

The amorphous oxide semiconductor thin film of Example 12 was produced in about the same manner as in Example 4 (film-forming conditions, film composition atomic ratios and treatment to increase resistance) except that Ce belonging to lanthanoids was contained. The film composition was analyzed by the ICP method to find that the [Ce]/([In]+[Sn]+[Zn]+[Ce]) was 0.03.

The oxide semiconductor thin film produced under the above-mentioned production conditions has the properties as indicated in FIG. 2. It was found that the crystallinity was amorphous, the carrier concentration was $9\times10^{16}$ cm$^{-3}$, and the Hall mobility was 13 cm$^2$/Vs. The resistivity measured by the four probe method was 5 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 130 nm/min, and the evaluation was good (soluble). The residues after the oxalic acid-based etching were evaluated as good (no residue).

EXAMPLE 13

The amorphous oxide semiconductor thin film of Example 13 was produced in about the same manner as in Example 4

(film-forming conditions, film composition atomic ratios and treatment to increase resistance) except that Nd belonging to lanthanoids was contained. The film composition was analyzed by the ICP method to find that the [Nd]/([In]+[Sn]+[Zn]+[Nd]) was 0.03.

The oxide semiconductor thin film produced under the above-mentioned production conditions has the properties as indicated in FIG. 2. It was found that the crystallinity was amorphous, the carrier concentration was $9\times10^{16}$ cm$^{-3}$, and the Hall mobility was 13 cm$^2$/Vs. The resistivity measured by the four probe method was 5 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 130 nm/min, and the evaluation was good (soluble). The residues after the oxalic acid-based etching were evaluated as good (no residue).

EXAMPLE 14

The amorphous oxide semiconductor thin film of Example 14 was produced in about the same manner as in Example 4 (film-forming conditions, film composition atomic ratios and treatment to increase resistance) except that Sm belonging to lanthanoids was contained. The film composition was analyzed by the ICP method to find that the [Sm]/([In]+[Sn]+[Zn]+[Sm]) was 0.03.

The oxide semiconductor thin film produced under the above-mentioned production conditions has the properties as indicated in FIG. 2. it was found that the crystallinity was amorphous, the carrier concentration was $9\times10^{16}$ cm$^{-3}$, and the Hall mobility was 13 cm$^2$/Vs. The resistivity measured by the four probe method was 5 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 130 nm/min, and the evaluation was good (soluble). The residues after the oxalic acid-based etching were evaluated as good (no residue).

EXAMPLE 15

The amorphous oxide semiconductor thin film of Example 15 was produced in about the same manner as in Example 4 (film-forming conditions, film composition atomic ratios and treatment to increase resistance) except that Eu belonging to lanthanoids was contained. The film composition was analyzed by the ICP method to find that the [Eu]/([In]+[Sn]+[Zn]+[Eu]) was 0.03.

The oxide semiconductor thin film produced under the above-mentioned production conditions has the properties as indicated in FIG. 2. It was found that the crystallinity was amorphous, the carrier concentration was $9\times10^{16}$ cm$^{-3}$, and the Hall mobility was 13 cm$^2$/Vs. The resistivity measured by the four probe method was 5 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 130 nm/min, and the evaluation was good (soluble). The residues after the oxalic acid-based etching were evaluated as good (no residue).

EXAMPLE 16

The amorphous oxide semiconductor thin film of Example 16 was produced in about the same manner as in Example 4 (film-forming conditions, film composition atomic ratios and treatment to increase resistance) except that Gd belonging to lanthanoids was contained. The film composition was analyzed by the ICP method to find that the [Gd]/([In]+[Sn]+[Zn]+[Gd]) was 0.03.

The oxide semiconductor thin film produced under the above-mentioned production conditions has the properties as indicated in FIG. 2. It was found that the crystallinity was amorphous, the carrier concentration was $9\times10^{16}$ cm$^{-3}$, and the Hall mobility was 13 cm$^2$/Vs. The resistivity measured by the four probe method was 5 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 130 nm/min, and the evaluation was good (soluble). The residues after the oxalic acid-based etching were evaluated as good (no residue).

EXAMPLE 17

The amorphous oxide semiconductor thin film of Example 17 was produced in about the same manner as in Example 4 (film-forming conditions, film composition atomic ratios and treatment to increase resistance) except that Tb belonging to lanthanoids was contained. The film composition was analyzed by the ICP method to find that the [Tb]/([In]+[Sn]+[Zn]+[Tb]) was 0.03.

The oxide semiconductor thin film produced under the above-mentioned production conditions has the properties as indicated in FIG. 2. It was found that the crystallinity was amorphous, the carrier concentration was $9\times10^{16}$ cm$^{-3}$, and the Hall mobility was 13 cm$^2$/Vs. The resistivity measured by the four probe method was 5 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 130 nm/min, and the evaluation was good (soluble). The residues after the oxalic acid-based etching were evaluated as good (no residue).

EXAMPLE 18

The amorphous oxide semiconductor thin film of Example 18 was produced in about the same manner as in Example 4 (film-forming conditions, film composition atomic ratios and treatment to increase resistance) except that Dy belonging to lanthanoids was contained. The film composition was analyzed by the ICP method to find that the [Dy]/([In]+[Sn]+[Zn]+[Dy]) was 0.03.

The oxide semiconductor thin film produced under the above-mentioned production conditions has the properties as indicated in FIG. 2. It was found that the crystallinity was amorphous, the carrier concentration was $9\times10^{16}$ cm$^{-3}$, and the Hall mobility was 13 cm$^2$/Vs. The resistivity measured by the four probe method was 5 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 130 nm/min, and the evaluation was good (soluble). The residues after the oxalic acid-based etching were evaluated as good (no residue).

EXAMPLE 19

The amorphous oxide semiconductor thin film of Example 19 was produced in about the same manner as in Example 4

(film-forming conditions, film composition atomic ratios and treatment to increase resistance) except that Er belonging to lanthanoids was contained. The film composition was analyzed by the ICP method to find that the [Er]/([In]+[Sn]+[Zn]+[Er]) was 0.03.

The oxide semiconductor thin film produced under the above-mentioned production conditions has the properties as indicated in FIG. 2. It was found that the crystallinity was amorphous, the carrier concentration was $9 \times 10^{16}$ cm$^{-3}$, and the Hall mobility was 13 cm$^2$/Vs. The resistivity measured by the four probe method was 5 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 130 nm/min, and the evaluation was good (soluble). The residues after the oxalic acid-based etching were evaluated as good (no residue).

EXAMPLE 20

The amorphous oxide semiconductor thin film of Example 20 was produced in about the same manner as in Example 4 (film-forming conditions, film composition atomic ratios and treatment to increase resistance) except that Yb belonging to lanthanoids was contained. The film composition was analyzed by the ICP method to find that the [Yb]/([In]+[Sn]+[Zn]+[Yb]) was 0.03.

The oxide semiconductor thin film produced under the above-mentioned production conditions has the properties as indicated in FIG. 2. It was found that the crystallinity was amorphous, the carrier concentration was $2.5 \times 10^{17}$ cm$^{-3}$, and the Hall mobility was 12 cm$^2$/Vs. The resistivity measured by the four probe method was 2 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was 130 nm/min, and the evaluation was good (soluble). The residues after the oxalic acid-based etching were evaluated as good (no residue).

COMPARATIVE EXAMPLE 1

The oxide semiconductor thin film of Comparative Example 1 was produced in about the same manner as in Example 1 (film-forming conditions, film composition atomic ratios and treatment to increase resistance). The film composition was analyzed by the ICP method to find that the [In]/([In]+[Sn]+[Zn]) was 0.90, the [Sn]/([In]+[Sn]+[Zn]) was 0.10, and the [Zn]/([In]+[Sn]+[Zn]) was 0.

The oxide semiconductor thin film produced under the above-mentioned production conditions has the properties as indicated in FIG. 3. It was found that the crystallinity was polycrystalline, the carrier concentration was $2 \times 10^{21}$ cm$^{-3}$, and the Hall mobility was 15 cm$^2$/Vs. The resistivity measured by the four probe method was 0.00021 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was less than 10 nm/min, and the evaluation was poor (insoluble).

COMPARATIVE EXAMPLE 2

The oxide semiconductor thin film of Comparative Example 2 was produced in about the same manner as in Comparative Example 1 (film-forming conditions, film composition atomic ratios and treatment to increase resistance) except that the treatment to increase resistance was not conducted.

The oxide semiconductor thin film produced under the above-mentioned production conditions has the properties as indicated in FIG. 3. It was found that the crystallinity was amorphous, the carrier concentration was $1 \times 10^{20}$ cm$^{-3}$, and the Hall mobility was 20 cm$^2$/Vs. The resistivity measured by the four probe method was 0.00315 Ωcm. The in-plane uniformity of resistivity (maximum resistivity value in the plane/minimum resistivity value in the plane) was 1.20. The etching rate with the PAN etching solution was 200 nm/min, and the evaluation was poor (soluble). The etching rate with the oxalic acid-based etching solution was 50 nm/min, and the evaluation was good (soluble). The residues after the oxalic acid-based etching was evaluated as poor (residues were observed).

COMPARATIVE EXAMPLE 3

The oxide semiconductor thin film of Comparative Example 3 was produced in about the same manner as in Example 1 (film-forming conditions, film composition atomic ratios and treatment to increase resistance). The film composition was analyzed by the ICP method to find that the [In]/([In]+[Sn]+[Zn]) was 0.66, the [Sn]/([In]+[Sn]+[Zn]) was 0.34, and the [Zn]/([In]+[Sn]+[Zn]) was 0.

The oxide semiconductor thin film produced under the above-mentioned production conditions has the properties as indicated in FIG. 3. It was found that the crystallinity was polycrystalline, the carrier concentration was $1 \times 10^{20}$ cm$^{-3}$, and the Hall mobility was 25 cm$^2$/Vs. The resistivity measured by the four probe method was 0.00252 Ωcm. The in-plane uniformity of resistivity (maximum resistivity value in the plane/minimum resistivity value in the plane) was 1.10. The etching rate with the PAN etching solution was less than 10 nm/min, and the evaluation was good (insoluble). The etching rate with the oxalic acid-based etching solution was less than 10 nm/min, and the evaluation was poor (insoluble).

COMPARATIVE EXAMPLE 4

The oxide semiconductor thin film of Comparative Example 4 was produced in about the same manner as in Example 1 (film-forming conditions, film composition atomic ratios and treatment to increase resistance). The film composition was analyzed by the ICP method to find that the [In]/([In]+[Sn]+[Zn]) was 0.90, the [Sn]/([In]+[Sn]+[Zn]) was 0, and the [Zn]/([In]+[Sn]+[Zn]) was 0.10.

The oxide semiconductor thin film produced under the above-mentioned production conditions has the properties as indicated in FIG. 3. It was found that the crystallinity was amorphous, the carrier concentration was $3 \times 10^{20}$ cm$^{-3}$, and the Hall mobility was 35 cm$^2$/Vs. The resistivity measured by the four probe method was 0.0006 Ωcm. The in-plane uniformity of resistivity (maximum resistivity value in the plane/minimum resistivity value in the plane) was 1.05. The etching rate with the PAN etching solution was 250 nm/min, and the evaluation was poor (soluble). The etching rate with the oxalic acid-based etching solution was 100 nm/min, and the evaluation was good (soluble). The residues after the oxalic acid-based etching were evaluated as good (no residue).

COMPARATIVE EXAMPLE 5

The oxide semiconductor thin film of Comparative Example 5 was produced in about the same manner as in Example 1 (film-forming conditions, film composition atomic ratios and treatment to increase resistance). The film composition was analyzed by the ICP method to find that the [In]/([In]+[Sn]+[Zn]) was 0.45, the [Sn]/([In]+[Sn]+[Zn]) was 0.50, and the [Zn]/([In]+[Sn]+[Zn]) was 0.05.

The oxide semiconductor thin film produced under the above-mentioned production conditions has the properties as indicated in FIG. 3. It was found that the crystallinity was amorphous, the carrier concentration was $8\times10^{19}$ cm$^{-3}$, and the Hall mobility was 15 cm$^2$/Vs. The resistivity measured by the four probe method was 0.005 Ωcm. The in-plane uniformity of resistivity (maximum resistivity value in the plane/minimum resistivity value in the plane) was 2.50. The etching rate with the PAN etching solution was less than 10 nm/min, and the evaluation was good (insoluble). The etching rate with the oxalic acid-based etching solution was less than 10 nm/min, and the evaluation was poor (insoluble).

COMPARATIVE EXAMPLE 6

The oxide semiconductor thin film of Comparative Example 6 was produced in about the same manner as in Example 1 (film-forming conditions, film composition atomic ratios and treatment to increase resistance). The film composition was analyzed by the ICP method to find that the [In]/([In]+[Sn]+[Zn]) was 0.20, the [Sn]/([In]+[Sn]+[Zn]) was 0.50, and the [Zn]/([In]+[Sn]+[Zn]) was 0.30.

The oxide semiconductor thin film produced under the above-mentioned production conditions has the properties as indicated in FIG. 3. It was found that the crystallinity was amorphous, the carrier concentration was $3\times10^{17}$ cm$^{-3}$, and the Hall mobility was 3 cm$^2$/Vs. The resistivity measured by the four probe method was 7 Ωcm. The in-plane uniformity of resistivity (maximum resistivity value in the plane/minimum resistivity value in the plane) was 2.10. The etching rate with the PAN etching solution was less than 10 nm/min, and the evaluation was good (insoluble). The etching rate with the oxalic acid-based etching solution was less than 10 nm/min, and the evaluation was poor (insoluble).

COMPARATIVE EXAMPLE 7

The oxide semiconductor thin film of Comparative Example 7 was produced in about the same manner as in Example 1 (film-forming conditions, film composition atomic ratios and treatment to increase resistance). The film composition was analyzed by the ICP method to find that the [In]/([In]+[Sn]+[Zn]) was 0.20, the [Sn]/([In]+[Sn]+[Zn]) was 0.05, and the [Zn]/([In]+[Sn]+[Zn]) was 0.75.

The oxide semiconductor thin film produced under the above-mentioned production conditions has the properties as indicated in FIG. 3. It was found that the crystallinity was amorphous, the carrier concentration was $4\times10^{16}$ cm$^{-3}$, and the Hall mobility was 3 cm$^2$/Vs. The resistivity measured by the four probe method was 53 Ωcm. The in-plane uniformity of resistivity (maximum resistivity value in the plane/minimum resistivity value in the plane) was 1.10. The etching rate with the PAN etching solution was 600 nm/min, and the evaluation was poor (soluble). The etching rate with the oxalic acid-based etching solution was 1000 nm/min, and the evaluation was good (soluble). The residues after the oxalic acid-based etching were evaluated as good (no residue).

COMPARATIVE EXAMPLE 8

The oxide semiconductor thin film of Comparative Example 8 was produced in about the same manner as in Example 1 (film-forming conditions, film composition atomic ratios and treatment to increase resistance) except that Ga belonging to the IIIB group was contained. The film composition was analyzed by the ICP method to find that the [In]/([In]+[Sn]+[Zn]) was 0.50, the [Sn]/([In]+[Sn]+[Zn]) was 0, the [Zn]/([In]+[Sn]+[Zn]) was 0.50, and the [Ga]/([In]+[Sn]+[Zn]+[Ga]) was 0.33.

The oxide semiconductor thin film produced under the above-mentioned production conditions has the properties as indicated in FIG. 3. It was found that the crystallinity was amorphous, the carrier concentration was $8\times10^{16}$ cm$^{-3}$, and the Hall mobility was 7 cm$^2$/Vs. The resistivity measured by the four probe method was 11 Ωcm. The in-plane uniformity of resistivity (maximum resistivity value in the plane/minimum resistivity value in the plane) was 1.20. The etching rate with the PAN etching solution was 100 nm/min, and the evaluation was poor (soluble). The etching rate with the oxalic acid-based etching solution was 50 nm/min, and the evaluation was good (soluble). The residues after the oxalic acid-based etching were evaluated as good (no residue).

COMPARATIVE EXAMPLE 9

The oxide semiconductor thin film of Comparative Example 9 was produced in about the same manner as in Comparative Example 8 (film-forming conditions, film composition atomic ratios and treatment to increase resistance) except that in the sputtering conditions, the atmosphere gas was changed to Ar 96 vol %+O$_2$ 4 vol % and the partial pressure of oxygen was changed to $16\times10^{-3}$ Pa, and the treatment to increase resistance was not conducted.

The oxide semiconductor thin film produced under the above-mentioned production conditions has the properties as indicated in FIG. 3. It was found that the crystallinity was amorphous, the carrier concentration was $1\times10^{16}$ cm$^{-3}$, and the Hall mobility was 1 cm$^2$/Vs. The resistivity measured by the four probe method was 630 Ωcm. The in-plane uniformity of resistivity (maximum resistivity value in the plane/minimum resistivity value in the plane) was 2.30. The etching rate with the PAN etching solution was 100 nm/min, and the evaluation was poor (soluble). The etching rate with the oxalic acid-based etching solution was 50 nm/min, and the evaluation was good (soluble). The residues after the oxalic acid-based etching were evaluated as good (no residue).

COMPARATIVE EXAMPLE 10

The oxide semiconductor thin film of Comparative Example 10 was produced in about the same manner as in Comparative Example 1 (film-forming conditions, film composition atomic ratios and treatment to increase resistance) except that Ce belonging to lanthanoids was contained. The film composition was analyzed by the ICP method to find that the [Ce]/([In]+[Sn]+[Zn]+[Ce]) was 0.04.

The oxide semiconductor thin film produced under the above-mentioned production conditions has the properties as indicated in FIG. 3. it was found that the crystallinity was polycrystalline, the carrier concentration was $2\times10^{21}$ cm$^{-3}$, and the Hall mobility was 15 cm$^2$/Vs. The resistivity measured by the four probe method was 0.00021 Ωcm. The in-plane uniformity of resistivity (maximum resistivity value in the plane/minimum resistivity value in the plane) was 1.05. The etching rate with the PAN etching solution was less than 10 nm/min, and the evaluation was good (insoluble). The etching rate with the oxalic acid-based etching solution was less than 10 nm/min, and the evaluation was poor (insoluble).

By the comparison of Example 1 with Comparative Examples 6 and 7 above, it was found that the PAN resistance and the oxalic acid etching rate varied significantly depending on an amount of Sn, even if the contents of indium were equal to each other. Accordingly, it is understood that the selective etching property is exhibited only within a specific range. Also, it was found that the in-plane uniformity is lost when an amount of Sn was too large.

[One Embodiment of Method of Producing Thin Film Transistor]

The method of producing a thin film transistor according to one embodiment of the invention uses an amorphous oxide semiconductor thin film according to the above-mentioned embodiment, as an active layer, which comprises steps of:

forming the active layer by etching the amorphous oxide semiconductor thin film with an etching solution containing a carboxylic acid, and forming an electrode layer by etching the electrode layer disposed upward the active layer with an etching solution containing an oxo acid.

Typically, oxalic acid or the like is used as the above-mentioned carboxylic acid, and phosphoric acid or the like is used as the oxo acid. Both of the etching solutions preferably contain a surfactant such as an anionic or nonionic surfactant. Thus, by containing such a surfactant, residues may be reduced.

The temperature of the etching solution is preferably 20 to 50° C., and more preferably 30 to 45° C.

According to the method of production of this embodiment, a dry etching process or a liftoff process is not needed. An active layer and an electrode layer upward the active layer can be patterned only by a photolithography method using wet etching. In general, a dry etching process for a metal oxide is expensive, the time of processing is long, and deficiency is apt to occur by depositions. As a result, a yield may be lower. Further, the liftoff process includes many steps, a yield is low. Thus, the liftoff process may prevent the resultant thin film transistor from making high-resolution, large dimension and mass production. Namely, patterning is conducted by the use of only a photolithography using a wet etching instead of a dry etching process and a liftoff process, to allow the economical efficiency and the productivity to increase.

As mentioned above, according to the method of production of this embodiment, costs of production can be lowered, Also, the productivity can be increased significantly: Further, the method of production of this embodiment is simple and excellent in large-area uniformity and reproducibility.

[One Embodiment of Thin Film Transistor]

FIG. 4 shows a schematic cross-sectional view of the essential parts of a bottom-gate type thin film transistor prepared on an insulating substrate, according to one embodiment of the invention.

In FIG. 4, the bottom-gate type thin film transistor 1 has a glass substrate 10, a gate electrode 25 formed on the glass substrate 10, a gate insulating film 24 prepared on the glass substrate 10 and the gate electrode 25, an amorphous oxide semiconductor thin film 2 as an active layer formed on the gate insulating film 24 upward the gate electrode 25, and a source electrode 22 and a drain electrode 23 formed on each end of the amorphous oxide semiconductor thin film 2. As the amorphous oxide semiconductor thin film 2, the amorphous oxide semiconductor thin film according to the above-mentioned embodiment is used.

Figure 5:
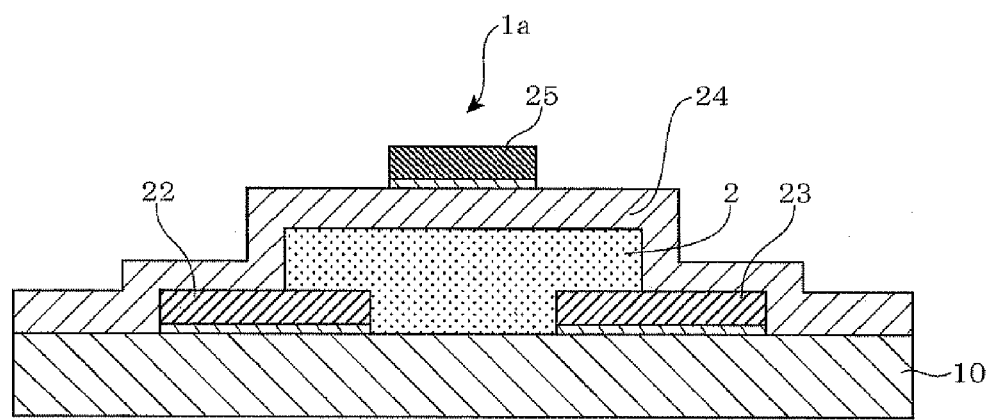
FIG. 5 is a schematic cross-sectional view showing essential parts of the top-gate type thin film transistor formed on an insulating substrate according to an application example of one embodiment of the invention.

Here, the thin film transistor of the invention is not limited to the bottom-gate type thin film transistor 1 having the above-mentioned structure, and may have various structures such as a bottom-gate type thin film transistor 1a as shown in FIG. 5.

Materials for forming the gate electrode 25, the source electrode 22 and the drain electrode 23 are not particularly limited. Materials generally used may be optionally selected within a range such that the effect of this embodiment is not lost. For instance, a transparent electrode such as indium tin oxide (ITO), indium zinc oxide, ZnO or $SnO_2$, a metal electrode such as Al, Ag, Cr, Ni, Mo, Au, Ti or Ta, or a metal electrode of a metal alloy containing these metals may be used. Also, two or more layers of them may be stacked to reduce the contact resistance and to increase surface strength.

Furthermore, a transparent conductive film may be used for each of the above-mentioned electrode layers. The transparent conductive film is preferably an amorphous oxide at the time of etching. For instance, indium zinc oxide or indium tin oxide (ITO) which is made to be amorphous with water or hydrogen can be used. A crystallized transparent conductive film such as indium tin oxide (ITO) may be difficult to etch with an oxalic acid-base etching solution.

An amorphous transparent conductive film may be crystallized by heat treatment after etching. This gives resistance against an oxalic acid-based etching solution so that degree of freedom for selective etching can be increased. Namely, the transparent conductive film is used for the electrode layer, whereby a transparent transistor can be easily produced using a wet etching process.

Materials for the gate insulating film 24 are not particularly limited, and materials generally used can be optionally selected within a range that the effects of the invention according to this embodiment are not lost, For instance, oxides such as $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$ and AlN can be used. Of these, $SiO_2$, SiNx, $Al_2O_3$, $Y_2O_3$, $Hf_2O_3$ and $CaHfO_3$ are preferably used, more preferred are $SiO_2$, SiNx, $Y_2O_3$, $Hf_2O_3$ and $CaHfO_3$, and particularly preferred is $Y_2O_3$. The number of oxygen in these oxides does not necessarily agreed with its stoichiometric ratio (not only $SiO_2$ but also $SiO_x$ are included, for example).

The gate insulating film 24 has a structure in which two or more different insulating films are stacked, though it is not shown in the drawing. Further, the gate insulating film 24 may be crystalline, polycrystalline or amorphous. However, polycrystalline and amorphous one are preferred which are industrially produced with ease.

The ratio of a channel width W and a channel length L W/L of the above-mentioned top-gate type thin film transistor 1a is normally 0.1 to 100, preferably 1 to 20, and particularly preferably 2 to 8. The reason therefor is that if the W/L exceeds 100, the amount of leakage current may increase or the on-off ratio may be lowered. If the W/L is smaller than 0.1, the field-effect mobility may be lowered or the pinch-off may be unclear.

Further, the channel length L is normally 0.1 to 1000 μm, preferably 1 to 100 μm, and further preferably 2 to 10 μm. The reason therefor is that if the channel length is less than 0.1 μm, production on the industrial basis may be difficult, or the amount of leakage current may increase. On the other hand, the channel length which exceeds 1000 μm is not preferable, since a device to be produced may become too large in size.

The thickness of the amorphous oxide semiconductor thin film 2 is normally 0.5 to 500 nm, preferably 1 to 150 nm, more preferably 3 to 80 nm, and particularly preferably 10 to 60 nm. This reason therefor is that if the thickness is smaller than 0.5 nm, it will become difficult to form a film uniformly on the industrial basis. On the other hand, if the thickness is larger than 500 nm, the time required for film-forming is too long to be industrially implemented. Further, if the thickness is within a range of 3 to 80 nm, the TFT characteristics such as mobility and an on-off ratio are particularly improved.

The field-effect mobility of the bottom-gate type thin film transistor 1 is typically 1 $cm^2/Vs$ or more. If the field-effect mobility is less than 1 $cm^2/Vs$, a switching speed may be later. To effectively avoid such a defect, the field-effect mobility is preferably 5 $cm^2/Vs$ or more, more preferably 18 $cm^2/Vs$ or more, further preferably 30 $cm^2/Vs$ or more, and particularly preferably 50 $cm^2/Vs$ or more.

The on-off ratio of the bottom-gate type thin film transistor 1 is made to be normally $10^3$ or more. However, it is preferably $10^4$ or more, more preferably $10^5$ or more, further preferably $10^6$ or more, and particularly preferably $10^7$ or more.

Preferably, the bottom-gate type thin film transistor 1 has a positive threshold voltage (Vth) and is in a normally-off state. If it has a negative threshold voltage (Vth) and is in a normally-on state, power consumption may increase.

The gate voltage and the drain voltage during driving the TFT are normally 100 V or lower, preferably 50 V or lower, and more preferably 20 V or lower. If they are larger than 100 V, power consumption may increase and decrease the usefulness.

In the invention, the gate electrode 25, the source electrode 22 and the drain electrode 23 are not necessarily Self-aligned to each other. However, they are preferably self-aligned because leakage current decreases.

The bottom-gate type thin film transistor 1 having the above-mentioned structure is wet etched with an oxalic acid-base etching solution when the amorphous oxide semiconductor thin film 2 is formed, and wet etched with a phosphoric acid-based etching solution when the source electrode 22 and the drain electrode 23 are formed. During wet etching with a phosphoric acid-based etching solution, the exposed amorphous oxide semiconductor thin film 2 is insoluble in the phosphoric acid-based etching solution. Namely, the amorphous oxide semiconductor thin film 2, the source electrode 22: and the drain electrode 23 can be patterned only by a photolithography method using wet etching instead of a dry etching process or a liftoff process, to improve the economical efficiency and productivity.

Also, the top-gate type thin film transistor 1a is wet etched with a phosphoric acid-based etching solution when the source electrode 22 and the drain electrode 23 are formed, and wet etched with an oxalic acid-based etching solution when the amorphous oxide semiconductor thin film 2 is formed. When the source electrode 22 and the drain electrode 23 are the above-mentioned metal electrodes or are made of a crystalline transparent conductor film, the electrodes are insoluble in an oxalic acid-based etching solution during wet etching with the oxalic acid-based etching solution. Namely, the amorphous oxide semiconductor thin film 2, the source electrode 22 and the drain electrode 23 can be patterned only by a photolithography method using wet etching instead of a dry etching process or a liftoff process, to improve the economical efficiency and productivity.

Preferably, the amorphous oxide semiconductor thin film 2 is etched with an etching solution containing a carboxylic acid, and further, a source electrode 22 and a drain electrode 23 which are etched with an etching solution containing an oxo acid are provided on the amorphous oxide semiconductor thin film 2.

By this, the amorphous oxide semiconductor thin film 2 and the electrodes 22 and 23 can be etched with an etching solution containing a carboxylic acid or an oxo acid. Namely, the amorphous oxide semiconductor thin film 2 is insoluble in a phosphoric acid-based etching solution and soluble in an oxalic acid-based etching solution. Thus, even when an etching solution containing a carboxylic acid which has almost the same or higher solubility as that of an oxalic acid-based etching solution is used, the amorphous oxide semiconductor thin film 2 can be dissolved. Also, even when an etching solution containing an oxo acid which has almost the same or higher solubility as that of a phosphoric acid-based etching solution and does not dissolve the amorphous oxide semiconductor thin film 2 is used, the source electrode 22 and the drain electrode 23 can be dissolved.

Here, a subject to be wet etched with an etching solution containing an oxo acid such as PAN may be a part of the gate electrode 25, the source electrode 22 or the drain electrode 23. However, in view of simple steps, all the gate electrode 25, source electrode 22 and drain electrode 23 are preferably wet etched with the same etching solution.

The thin film transistor of the invention may be a bottom-gate type thin film transistor 1 as shown in FIG. 4, or a top-gate type thin film transistor 1a as shown in FIG. 5. However, preferred is a bottom-gate type thin film transistor having good TFT characteristics such as mobility.

Although not shown in the figure, the amorphous oxide semiconductor thin film 2 preferably varies in the composition in the direction of film thickness and has a first region far from a gate insulating film 24 and a second region near the gate insulating film 24, and the oxygen concentration in the second region is higher than the oxygen concentration in the first region.

By this, since the amount of oxygen on the side near the gate insulating film 24 is large, the carrier density in the vicinity of the interface of the gate insulating film 24 can be reduced, and an on-off ratio of the transistor can be improved.

Although not shown in the drawing, the amorphous oxide semiconductor thin film 2 preferably varies in the composition in the direction of film thickness and has a first region far from a gate insulating film 24 and a second region near the gate insulating film 24, and the Sn concentration in the second region is lower than the Sn concentration in the first region.

By this, since the amount of Sn on the side near the gate insulating film 24 is small, the carrier density in the vicinity of the interface of the gate insulating film 24 can be reduced, and an on-off ratio of the transistor can be improved while maintaining PAN resistance.

As explained above, in the bottom-gate type thin film transistor 1 according to this embodiment, the amorphous oxide semiconductor thin film 2, the source electrode 22 and the drain electrode 23 can be patterned only by a photolithography method using wet etching in place of a dry etching process or a liftoff process. Thus, a cost of production can be lowered. Also, the productivity can be increased significantly. Further, the bottom-gate type thin film transistor 1 has high field-effect mobility and high reliability, the transparent active layer, and a high-resolution.

Next, thin film transistors as below were produced by using the amorphous oxide semiconductor thin film prepared by the above-mentioned Examples and Comparative Examples, and evaluations were carried out. Now, Examples and Comparative Examples of the thin film transistor will be explained.

EXAMPLE A1

Bottom-gate Type Transparent Thin Film Transistor/insulating Substrate

First, as shown in FIG. 4, an Al film was formed on a glass substrate 10 by using the DC magnetron sputtering method.

Then, a photoresist was applied thereon, patterns of a gate electrode 25 and a wiring were exposed through a photomask, and development was conducted with a developing solution. Subsequently, etching was conducted with a PAN-type etching solution at 35° C. (phosphoric acid: 91.4 wt %, nitric acid: 3.3 wt % and acetic acid: 5.3 wt %) to form the gate electrode 25 and the wiring pattern.

Then, a $SiN_x$ film was formed as a gate insulating film 24 in a thickness of 300 nm by the CVD method.

Then, an amorphous oxide semiconductor thin film 2 was formed in a thickness of 30 nm under the same conditions as in Example 1 except for the film-forming time. Subsequently, a photoresist was applied thereon, an active layer pattern was exposed through a photomask, and development was conducted with a developing solution. Then, the active layer was formed from the amorphous oxide semiconductor thin film 2 by etching with ITO-06N (Kanto Chemical Co., Inc.) at 35° C. as an oxalic acid-based etching solution.

Films of Mo and Al were formed in sequential order by the DC magnetron sputtering method. Then, a photoresist was applied thereon, patterns of a source electrode 22, a drain electrode 23 and a wiring were exposed through a photomask, and development was conducted using a developing solution. Subsequently, etching was conducted with a PAN-type etching solution at 35° C. (phosphoric acid: 91.4 wt %, nitric acid: 3.3 wt % and acetic acid: 5.3 wt %) to form the source electrode 22, the drain electrode 23 and the wiring pattern.

In the bottom-gate type thin film transistor 1 of this example, the channel length L was made to be 50 µm and the channel width W was made to be 100 µm.

The bottom-gate type thin film transistor 1 had a field-effect mobility of 25 $cm^2$/Vs, an on-off ratio of $10^5$ or more and a threshold voltage (Vth) of +2.0 V (normally-off), and the output characteristics indicated a clear pinch-off. Namely, this bottom-gate type thin film transistor 1 had sufficiently good transistor characteristics.

EXAMPLE A2

Bottom-gate Type Transparent Thin Film Transistor/insulating Substrate

A bottom-gate type thin film transistor 1 of Example A2 was produced in about the same manner as in Example A1 above except that the amorphous oxide semiconductor thin film 2 prepared in Example 4, 7, 8 or 15 was used in place of the one in Example 1.

The bottom-gate type thin film transistor 1 using the amorphous oxide semiconductor thin film 2 prepared in Example 4 had a filed-effect mobility of 35 $cm^2$/Vs, an on-off ratio of $10^4$ or more and a threshold voltage (Vth) of +1.0 V (normally-off), and the output characteristics indicated a clear pinch-off. Namely, this bottom-gate type thin film transistor 1 had sufficiently good transistor characteristics.

Also, the bottom-gate type thin film transistor 1 using the amorphous oxide semiconductor thin film 2 prepared in Example 7 had a filed-effect mobility of 30 $cm^2$/Vs, an on-off ratio of $10^6$ or more and a threshold voltage (Vth) of +1.0 V (normally-off), and the output characteristics indicated a clear pinch-off. Namely, this bottom-gate type thin film transistor 1 had sufficiently good transistor characteristics.

The bottom-gate type thin film transistor 1 using the amorphous oxide semiconductor thin film 2 prepared in Example 8 had a filed-effect mobility of 25 $cm^2$/Vs, an on-off ratio of $10^7$ or more and a threshold voltage (Vth) of +1.5 V (normally-off), and the output characteristics indicated a clear pinch-off. Namely, this bottom-gate type thin film transistor 1 had sufficiently good transistor characteristics.

The bottom-gate type thin film transistor 1 using the amorphous oxide semiconductor thin film 2 prepared in Example 15 had a filed-effect mobility of 30 $cm^2$/Vs, an on-off ratio of $10^6$ or more and a threshold voltage (Vth) of +1.0 V (normally-off), and the output characteristics indicated a clear pinch-off. Namely, this bottom-gate type thin film transistor 1 had sufficiently good transistor characteristics.

Namely, each of the bottom-gate type thin film transistors 1 had sufficiently good transistor characteristics in the same degree as those in Example A1. In the examples in which atoms belonging to the IIIB group or the lanthanoids were added, on-off ratios were improved significantly. Hysterisis which was occurring at the time of determination of a transfer characteristic decreased considerably, whereby the operation stability was improved.

As shown in FIGS. 1 and 2, the bottom-gate type thin film transistor 1 was produced in almost the same manner as in Example Al except that the amorphous oxide semiconductor thin film 2 of the other examples was used. As a result, TFT characteristics were found in each of the bottom-gate type thin film transistors 1.

EXAMPLE B1

Top-gate Type Transparent Thin Film Transistor/insulating Substrate

First, as shown in FIG. 5, Mo and Al films were sequentially formed on a glass substrate 10 by using the DC magnetron sputtering method. Then, a photoresist was applied thereon, patterns of a source electrode 22, a drain electrode 23 and a wiring were exposed through a photomask, and development was conducted with a developing solution. Subsequently, etching was conducted with a PAN-type etching solution at 35° C. (phosphoric acid: 91.4 wt %, nitric acid: 3.3 wt % and acetic acid: 5.3 wt %) to form the source electrode 22, the drain electrode 23 and the wiring pattern. In the top-gate type thin film transistor 1a of this example, the channel length L was made to be 50 µm and the channel width W was made to be 100 µm.

Then, an amorphous oxide semiconductor thin film 2 was formed in a thickness of 30 nm under the same conditions as in Example 1 above except for the film-forming time. Subsequently, a photoresist was applied thereon, an active layer pattern was exposed through a photomask, and development was conducted with a developing solution. Then, the active layer was formed from the amorphous oxide semiconductor thin film 2 by etching with ITO-06N (Kanto Chemical Co., Inc.) at 35° C. as an oxalic acid-based etching solution.

Next, a $SiN_x$ film was formed as a gate insulating film 24 in a thickness of 300 nm by the CVD method.

Then, a Al film was formed by using the DC magnetron sputtering method. Then, a photoresist was applied thereon, patterns of a gate electrode 25 and a wiring were exposed through a photomask, and development was conducted using a developing solution. Subsequently, etching was conducted with a PAN-type etching solution at 35° C. (phosphoric acid: 91.4 wt %, nitric acid: 3.3 wt % and acetic acid: 5.3 wt %) to form the gate electrode 25 and the wiring pattern.

The top-gate type thin film transistor 1a had a field-effect mobility of 25 $cm^2$/Vs, an on-off ratio of $10^5$ or more and a threshold voltage (Vth) of +2.0 V (normally-off), and the output characteristics indicated a clear pinch-off. Namely, this top-gate type thin film transistor 1a had sufficiently good transistor characteristics.

COMPARATIVE EXAMPLE A0

Bottom-gate Type Transparent Thin Film Transistor/insulating Substrate

A bottom-gate type thin film transistor 1 of Comparative Example A0 was tried to produce in about the same manner as in Example A1 above except that the amorphous oxide semiconductor thin film 2 prepared in Comparative Example 6 was used in place of the one prepared in Example 1 above.

However, the active layer could not be patterned, thereby the bottom-gate type thin film transistor 1 could not be produced.

As shown in FIG. 3, bottom-gate type thin film transistors 1 were produced in about the same manner as in Example A1 except that the amorphous oxide semiconductor thin films 2 prepared in the other comparative examples were used. However, it could not be confirmed that the bottom-gate type thin film transistors have any TFT characteristics. Namely, in the bottom-gate type thin film transistors 1 using the amorphous oxide semiconductor thin films 2 prepared in Comparative Examples 1, 3, 5, 6 and 10, which could not be etched with an oxalic acid-based etching solution, an active layer could not be patterned. Alternatively, the bottom-gate type thin film transistors 1 using the amorphous oxide semiconductor thin films 2 prepared in Comparative Examples 2, 4, 7, 8 and 9, which were etched with an oxalic acid-based etching solution, could not indicate thin film transistor characteristics. Confirming the bottom-gate type thin film transistors 1, the amorphous oxide semiconductor thin films 2 used had no PAN resistance, As a result, the active layer was dissolved in the PAN and disappeared.

COMPARATIVE EXAMPLE B0

Top-gate Type Transparent Thin Film Transistor/insulating Substrate

A top-gate type thin film transistor 1a of Comparative Example B0 was tried to produce in about the same manner as in Example B1 except that the amorphous oxide semiconductor thin film 2 prepared in Comparative Example 6 was used in place of the one prepared in Example 1 above. However, the active layer could not be patterned so that a thin film transistor could not be produced.

The top-gate type thin film transistors 1a using the amorphous oxide semiconductor thin films 2 prepared in Comparative Examples 2, 4, 7, 8 and 9, which could be etched with an oxalic acid-based etching solution, could be produced independently of PAN resistance. Further, although not shown in the drawing, as to the top-gate type thin film transistors 1a using the amorphous oxide semiconductor thin films 2 prepared in Comparative Examples 7, 8 and 9, TFT characteristics could be found.

[One Embodiment of Display Apparatus]

Figure 6:
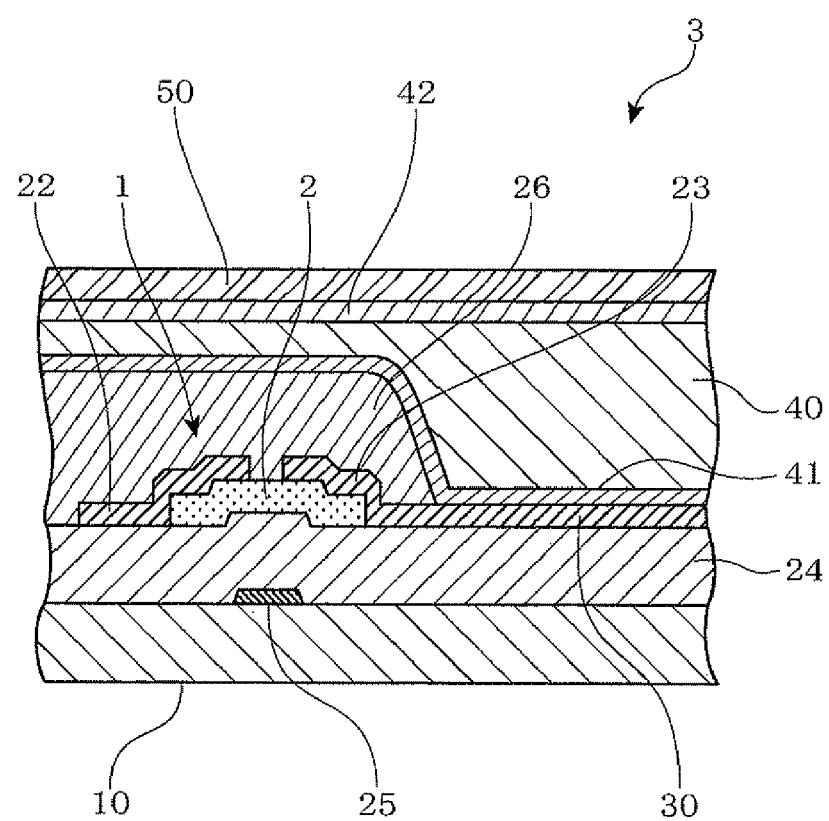
FIG. 6 is a schematic enlarged cross-sectional view of essential parts, which explains the constitution of the field-effect type thin film transistor for a display apparatus according to one embodiment of the invention.

FIG. 6 shows a schematic enlarged cross-sectional view of the essential parts for explaining the configuration of the display apparatus according to one embodiment of the invention.

In FIG. 6, the image display apparatus 3 has a glass substrate 10, liquid crystal 40 as a light control element, the above-mentioned bottom-gate type thin film transistor 1 for driving the liquid crystal 40, a pixel electrode 30 and an opposing electrode 50. The bottom-gate type thin film transistor 1 which is a field-effect type transistor is disposed on a transparent glass substrate 10 in matrix.

Here, the light control element used in the invention is not limited to ones containing liquid crystal. For instance, the light control element may be one which contains electrophoresis particles and uses them, or one which contains an organic EL device or inorganic EL device which emits light for themselves. The device using an organic EL device or inorganic EL device which emits for themselves may be called as a light-emitting apparatus.

The substrate on which the bottom-gate type thin film transistor 1 is formed is not limited to a transparent glass substrate 10. For instance, it may be a resin film having flexibility.

The bottom-gate type thin film transistor 1 has a gate electrode 25 formed on a glass substrate 10, a gate insulating film 24 formed on the gate electrode 25 and the glass substrate 10, an amorphous oxide semiconductor thin film 2 as an active layer, and a source electrode 22 and a drain electrode 23 which are formed on each end of the amorphous oxide semiconductor thin film 2. On the bottom-gate type thin film transistor 1, an interlayer insulating film 26 composed of silicon oxide or silicon nitride is formed.

The image display apparatus 3 is not limited to ones using the bottom-gate type thin film transistor 1. For instance, transistors having various configurations such as a top-gate type may be used. Further, a configuration in which a switching transistor, a driving transistor, etc. are provided for one pixel may be employed.

A pixel electrode 30 is formed on the gate insulating film 24 and is connected to the drain electrode 23. On the pixel electrode 30 and the interlayer insulating film 26, high-resistant films 41 and 42 as orientation films and an opposing electrode 50 are formed (normally, the high-resistant film 42 and the opposing electrode 50 are formed on an opposing substrate (not shown)). Liquid crystal 40 is injected in a gap between the high-resistant film 41 and the high-resistant film 42.

As explained above, according to the image display apparatus 3 of this embodiment, at the time of producing the bottom-gate type thin film transistor 1, the amorphous oxide semiconductor thin film 2, the source electrode 22 and the drain electrode 23 can be patterned only by a photolithography method using wet etching in place of a dry etching process or a liftoff process. Thus, a cost of production can be lowered. Also, the productivity can be increased considerably.

[First Embodiment of Sputtering Target]

The invention is also effective as an invention concerning a sputtering target. The sputtering target of this embodiment contains indium, tin, zinc, a IIIB group element (at least one selected from B, Al, Ga and Tl) and oxygen, wherein atomic ratios of the number of indium atoms ([In]), the number of tin atoms ([Sn]), the number of zinc atoms ([Zn]) and the number of atoms of the IIIB group element [IIIB]) are $$0.1 < [In]/([In]+[Sn]+[Zn]) < 0.5$$

$$0.1 < [Sn]/([In]+[Sn]+[Zn]) < 0.2$$

$$0.3 < [Zn]/([In]+[Sn]+[Zn]) < 0.8$$

$$0.0001 < [IIIB]/([In]+[Sn]+[Zn]+[IIIB]) < 0.33, \text{ and}$$

wherein a bulk resistance is $10^{-3}$ to $10^3$ mΩ, and a sintered density is 80% or more.

According to the sputtering target of this embodiment, as mentioned above, an amorphous oxide semiconductor thin film can be prepared which has a carrier density of less than $10^{+18}$ cm$^{-3}$, is insoluble in a phosphoric acid-based etching solution, and is soluble in an oxalic acid-based etching solution. Further, the sputtering target contains a IIIB group element other than indium, whereby a carrier density easily decreases and the low carrier density state is stabilized, and the reliability in the case of using the amorphous oxide semiconductor thin film for a transistor increases.

The amorphous oxide semiconductor thin film prepared by using this sputtering target can be wet etched with an oxalic acid-based etching solution and further wet etched with a phosphoric acid-based etching solution to form an electrode pattern on the amorphous oxide semiconductor thin film. Thus, a cost of production can be lowered while the productivity and the like can be improved.

[Second Embodiment of Sputtering Target]

The sputtering target of this embodiment contains indium, tin, zinc, a lanthanoid series element (at least one selected from La, Ce, Pr, Nd, Pm, Sm, Eu, Gd, Tb, Dy, Ho, Er, Tm, Yb and Lu) and oxygen, wherein atomic ratios of the number of indium atoms ([In]), the number of tin atoms ([Sn]), the number of zinc atoms ([Zn]) and the number of atoms of the lanthanoid series element ([Ln]) are $$0.1<[In]/([In]+[Sn]+[Zn])<0.5$$

$$0.1<[Sn]/([In]+[Sn]+[Zn])<0.2$$

$$0.3<[Zn]/([In]+[Sn]+[Zn])<0.8$$

$$0.0001<[Ln]/([In]+[Sn]+[Zn]+[Ln])<0.1, \text{ and}$$

wherein a bulk resistance is $10^{-3}$ to $10^3$ mΩ, and a sintered density is 80% or more.

According to the sputtering target of this embodiment, as mentioned above, an amorphous oxide semiconductor thin film can be prepared which has a carrier density of less than $10^{+18}$ cm$^{-3}$, is insoluble in a phosphoric acid-based etching solution and is soluble in an oxalic acid-based etching solution. Further, the sputtering target contains a lanthanoid element, whereby a carrier density easily decreases and the low carrier density state is stabilized, and the reliability in the case of using the amorphous oxide semiconductor thin film for a transistor increases.

The amorphous oxide semiconductor thin film prepared by using this sputtering target can be wet etched with an oxalic acid-based etching solution and further wet etched with a phosphoric acid-based etching solution to obtain an electrode pattern on the amorphous oxide semiconductor thin film. Thus, a cost of production can be lowered while the productivity and the like can be improved.

The amorphous oxide semiconductor thin film, method of preparing thereof, method of producing a thin film transistor, field-effect type transistor, image display apparatus and sputtering target of the invention are explained while indicating preferred embodiments. However, the amorphous oxide semiconductor thin film, method of preparing thereof, method of producing a thin film transistor, field-effect type transistor, image display apparatus and sputtering target of the invention are not limited to the above-mentioned embodiments. Various modifications within the scope of the invention can be employed without saying.

For instance, the image display apparatus is not limited to a liquid crystal image display apparatus, and it may be an EL image display apparatus or the like.

INDUSTRIAL APPLICABILITY

The amorphous oxide semiconductor thin film of the invention can be widely used for various semiconductor devices, semiconductor apparatus, circuits or the like. For instance, it can also be widely employed as a component of IC cards, ID tags, or the like.

The invention claimed is:

1. An amorphous oxide semiconductor thin film having a carrier density of less than $10^{+18}$ cm$^{-3}$, and being insoluble in a phosphoric acid-based etching solution and soluble in an oxalic acid-based etching solution.

2. The amorphous oxide semiconductor thin film according to claim 1, wherein the etching rate in a phosphoric acid-based etching solution at 35° C. is less than 10 nm/min, and the etching rate in an oxalic acid-based etching solution at 35° C. is 20 nm/min or more.

3. The amorphous oxide semiconductor thin film according to claim 1, which comprises indium, tin, zinc and oxygen, and wherein when an atomic ratio of the number of tin atoms ([Sn]), relative to the sum of the number of indium atoms ([In]), the number of tin atoms ([Sn]) and the number of zinc atoms ([Zn]) is more than 0.1 and less than 0.2, the atomic ratio 1 below is satisfied, and when the atomic ratio of the [Sn] is 0.2 or more and less than 0.3, the atomic ratio 2 below is satisfied:

Atomic Ratio 1

$$0.1<[In]/([In]+[Sn]+[Zn])<0.5$$

$$0.1<[Sn]/([In]+[Sn]+[Zn])<0.2$$

$$0.3<[Zn]/([In]+[Sn]+[Zn])<0.8$$

Atomic Ratio 2

$$0.01<[In]/([In]+[Sn]+[Zn])<0.3$$

$$0.2[Sn]/([In]+[Sn]+[Zn])<0.3$$

$$0.4<[Zn]/([In]+[Sn]+[Zn])<0.8.$$

4. The amorphous oxide semiconductor thin film according to claim 3, wherein an atomic ratio of the [Sn] relative to the sum of the [Sn] and [Zn] is $$0.1<[Sn]/([Sn]+[Zn])<0.3.$$

5. The amorphous oxide semiconductor thin film according to claim 3, which comprises a IIIB group element other than indium (at least one of B, Al, Ga and Tl), and wherein an atomic ratio of the number of atoms of the IIIB group element ([IIIB]) relative to the sum of the [In], [Sn], [Zn] and [IIIB] is $$0.0001<[IIIB]/([In]+[Sn]+[Zn]+[IIIB])<0.33.$$

6. The amorphous oxide semiconductor thin film according to claim 3, which comprises a lanthanoid series element (at least one of La, Ce, Pr, Nd, Pm, Sm, Eu, Gd, Tb, Dy, Ho, Er, Tm, Yb and Lu), and wherein an atomic ratio of the number of atoms of the lanthanoid series element ([Ln]) relative to the sum of the [In], [Sn], [Zn] and [Ln] is $$0.0001<[Ln]/([In]+[Sn]+[Zn]+[Ln])<0.1.$$

7. A method of producing an amorphous oxide semiconductor thin film according to claim 1, which comprises steps of:

forming an amorphous oxide semiconductor thin film having a carrier density of $10^{+18}$ cm$^{-3}$ or more under a condition of the temperature of a substrate being lower than 150° C., and adjusting the carrier density to less than $10^{+18}$ cm$^{-3}$ by applying a treatment to increase resistance to the amorphous thin film.

8. The method of producing an amorphous oxide semiconductor thin film according to claim 7, wherein the treatment to increase resistance is a heat treatment conducted under conditions of at 150 to 650° C. for 0.5 to 12,000 minutes in the presence of oxygen.

9. A method of producing a thin film transistor using an amorphous oxide semiconductor thin film according to claim 1, as an active layer, which comprises steps of:
   forming the active layer by etching the active layer using the amorphous oxide semiconductor thin film with an etching solution containing a carboxylic acid, and
   forming an electrode layer by etching the electrode layer disposed upward the active layer with an etching solution containing an oxo acid.

10. A field-effect type transistor using an amorphous oxide semiconductor thin film according to claim 1, as an active layer.

11. The field-effect type transistor according to claim 10, wherein the amorphous oxide semiconductor thin film is etched with an etching solution containing a carboxylic acid, and an electrode etched with an etching solution containing an oxo acid is provided on the amorphous oxide semiconductor thin film.

12. The field-effect type transistor according to claim 10, wherein the amorphous oxide semiconductor thin film varies in the composition in the direction of film thickness and has a first region far from a gate insulating film and a second region near the gate insulating film, and the oxygen concentration in the second region is higher than the oxygen concentration in the first region.

13. The field-effect type transistor according to claim 10, wherein the amorphous oxide semiconductor thin film varies in the composition in the direction of film thickness and has a first region far from a gate insulating film and a second region near the gate insulating film, and the Sn concentration in the second region is lower than the Sn concentration in the first region.

14. A light emitting apparatus comprising
   a light control element, and
   a field-effect type transistor according to claim 10, for driving the light control element.

15. The light emitting apparatus according to claim 14, wherein the light control element and the field-effect type transistor are integrated.

16. A display apparatus using a light emitting apparatus according to claim 14.

17. A sputtering target comprising indium, tin, zinc, a IIIB group element other than indium (at least one selected from B, Al, Ga and Tl) and oxygen, wherein atomic ratios of the number of indium atoms ([In]), the number of tin atoms ([Sn]), the number of zinc atoms ([Zn]) and the number of atoms of the IIIB group element ([IIIB]) are:

$0.1<[In]/([In]+[Sn]+[Zn])<0.5$ $0.1<[Sn]/([In]+[Sn]+[Zn])<0.2$ $0.3<[Zn]/([In]+[Sn]+[Zn])<0.8$ $0.0001<[IIIB]/([In]+[Sn]+[Zn]+[IIIB])<0.33$, and wherein a bulk resistance is $10^{-3}$ to $10^3$ mΩ, and a sintered density is 80% or more.

18. A sputtering target comprising indium, tin, zinc, a lanthanoid series element (at least one selected from La, Ce, Pr, Nd, Pm, Sm, Eu, Gd, Tb, Dy, Ho, Er, Tm, Yb and Lu) and oxygen, wherein atomic ratios of the number of indium atoms ([In]), the number of tin atoms ([Sn]), the number of zinc atoms ([Zn]) and the number of lanthanoid series atoms ([Ln]) are:

$0.1<[In]/([In]+[Sn]+[Zn])<0.5$ $0.1<[Sn]/([In]+[Sn]+[Zn])<0.2$ $0.3<[Zn]/([In]+[Sn]+[Zn])<0.8$ $0.0001<[Ln]/([In]+[Sn]+[Zn]+[Ln])<0.1$, and wherein a bulk resistance is $10^{-3}$ to $10^3$ mΩ, and a sintered density is 80% or more.

* * * * *

UNITED STATES PATENT AND TRADEMARK OFFICE
CERTIFICATE OF CORRECTION

| | |
|---|---|
| PATENT NO. | : 8,232,552 B2 |
| APPLICATION NO. | : 12/593045 |
| DATED | : July 31, 2012 |
| INVENTOR(S) | : Koki Yano et al. |

It is certified that error appears in the above-identified patent and that said Letters Patent is hereby corrected as shown below:

Column 34, Line 38, Claim 3 reads: "$0.2[Sn]/([In]+[Sn]+[Zn])<0.3$" should read --$0.2\leqq[Sn]/([In]+[Sn]+[Zn])<0.3$--.

Signed and Sealed this
Twenty-ninth Day of January, 2013

David J. Kappos
*Director of the United States Patent and Trademark Office*